US010784765B1

(12) United States Patent
Vinciarelli et al.

(10) Patent No.: US 10,784,765 B1
(45) Date of Patent: Sep. 22, 2020

(54) METHOD AND APPARATUS FOR DELIVERING POWER TO SEMICONDUCTORS

(71) Applicant: VLT, Inc., Andover, MA (US)

(72) Inventors: Patrizio Vinciarelli, Boston, MA (US); Andrew T. D'Amico, Beverly Hills, CA (US)

(73) Assignee: VLT, Inc., Andover, MA (US)

( * ) Notice: Subject to any disclaimer, the term of this patent is extended or adjusted under 35 U.S.C. 154(b) by 0 days.

(21) Appl. No.: 16/299,243

(22) Filed: Mar. 12, 2019

Related U.S. Application Data

(60) Division of application No. 15/616,288, filed on Jun. 7, 2017, now Pat. No. 10,277,105, which is a
(Continued)

(51) Int. Cl.
*H02M 1/08* (2006.01)
*H02M 3/155* (2006.01)
(Continued)

(52) U.S. Cl.
CPC .......... *H02M 1/08* (2013.01); *H01L 23/5383* (2013.01); *H01L 23/5384* (2013.01);
(Continued)

(58) Field of Classification Search
None
See application file for complete search history.

(56) References Cited

U.S. PATENT DOCUMENTS

| 5,438,294 A | 8/1995 | Smith |
| 6,031,743 A | 2/2000 | Carpenter et al. |

(Continued)

FOREIGN PATENT DOCUMENTS

| EP | 2863531 | 4/2015 |
| JP | H02280666 | 11/1990 |

OTHER PUBLICATIONS

U.S. Appl. No. 14/731,287, filed Jun. 4, 2015, Vinciarelli et al.
(Continued)

*Primary Examiner* — Cassandra F Cox
(74) *Attorney, Agent, or Firm* — Fish & Richardson P.C.

(57) ABSTRACT

A semiconductor package includes a VLSI semiconductor die and one or more output circuits connected to supply power to the die mounted to a package substrate. The output circuit(s), which include a transformer and rectification circuitry, provide current multiplication at an essentially fixed conversion ratio, K, in the semiconductor package, receiving AC power at a relatively high voltage and delivering DC power at a relatively low voltage to the die. The output circuits may be connected in series or parallel as needed. A driver circuit may be provided outside the semiconductor package for receiving power from a source and driving the transformer in the output circuit(s), preferably with sinusoidal currents. The driver circuit may drive a plurality of output circuits. The semiconductor package may require far fewer interface connections for supplying power to the die. Multi-output POL circuits may be used in conjunction with on-chip rail-selection and regulation circuitry to further improve efficiency. A three-stage power conversion system includes off-package, on-package and on-chip conversion stages.

44 Claims, 30 Drawing Sheets

Related U.S. Application Data continuation-in-part of application No. 15/091,346, filed on Apr. 5, 2016, now Pat. No. 10,158,357.

(51) Int. Cl.
*H01L 23/64* (2006.01)
*H01L 23/538* (2006.01)
*H01L 25/18* (2006.01)

(52) U.S. Cl.
CPC ...... *H01L 23/5385* (2013.01); *H01L 23/5386* (2013.01); *H01L 23/645* (2013.01); *H01L 25/18* (2013.01); *H02M 3/155* (2013.01)

(56) References Cited

U.S. PATENT DOCUMENTS

| | | | |
|---|---|---|---|
| 6,035,261 A | | 3/2000 | Carpenter et al. |
| 6,118,186 A | | 9/2000 | Scott et al. |
| 6,275,958 B1 | | 8/2001 | Carpenter et al. |
| 6,300,749 B1 | | 10/2001 | Castelli et al. |
| 6,311,279 B1 | * | 10/2001 | Nguyen .................. G06F 1/263 |
| | | | 307/66 |
| 6,421,262 B1 | | 7/2002 | Saxelby et al. |
| 6,466,458 B2 | | 10/2002 | Zhang et al. |
| 6,603,292 B1 | | 8/2003 | Schouten et al. |
| 6,700,361 B2 | | 3/2004 | Gregorius |
| 6,788,033 B2 | | 9/2004 | Vinciarelli |
| 6,911,848 B2 | | 6/2005 | Vinciarelli |
| 6,930,893 B2 | | 8/2005 | Vinciarelli |
| 6,934,166 B2 | | 8/2005 | Vinciarelli |
| 6,969,909 B2 | | 11/2005 | Briere |
| 6,975,098 B2 | | 12/2005 | Vinciarelli |
| 6,984,965 B2 | | 1/2006 | Vinciarelli |
| 6,985,341 B2 | | 1/2006 | Vinciarelli et al. |
| 7,145,786 B2 | | 12/2006 | Vinciarelli |
| 7,245,509 B1 | | 7/2007 | Chan et al. |
| RE40,072 E | | 2/2008 | Prager et al. |
| 7,521,909 B2 | | 4/2009 | Dow et al. |
| 7,561,446 B1 | | 7/2009 | Vinciarelli |
| 7,768,807 B2 | | 8/2010 | Chen et al. |
| 8,232,783 B2 | | 7/2012 | Yanagawa |
| 8,288,846 B2 | | 10/2012 | Narendra et al. |
| 8,582,333 B2 | | 11/2013 | Oraw et al. |
| 9,087,656 B1 | | 7/2015 | Vinciarelli |
| 9,112,422 B1 | | 8/2015 | Vinciarelli |
| 9,166,481 B1 | | 10/2015 | Vinciarelli et al. |
| 9,660,537 B1 | | 5/2017 | Vinciarelli |
| 9,765,750 B2 | | 9/2017 | Ferguson et al. |
| 10,158,357 B1 | | 12/2018 | Vinciarelli et al. |
| 2003/0227280 A1 | | 12/2003 | Vinciarelli et al. |
| 2006/0066104 A1 | * | 3/2006 | Melfi ..................... H02J 9/066 |
| | | | 290/1 A |
| 2006/0291265 A1 | | 12/2006 | Schrom et al. |
| 2007/0297198 A1 | | 12/2007 | Chang |
| 2008/0116589 A1 | | 5/2008 | Li et al. |
| 2009/0016083 A1 | | 1/2009 | Soldano et al. |
| 2013/0030534 A1 | | 1/2013 | DeLurio et al. |
| 2013/0069608 A1 | | 3/2013 | Gakhar et al. |
| 2014/0152350 A1 | | 6/2014 | Ikriannikov et al. |
| 2015/0188407 A1 | | 7/2015 | Golder et al. |
| 2016/0173000 A1 | | 6/2016 | Lu et al. |
| 2016/0226385 A1 | * | 8/2016 | Phadke ................. H02M 3/335 |

OTHER PUBLICATIONS

U.S. Appl. No. 14/822,561, filed Aug. 10, 2015, Vinciarelli.
U.S. Appl. No. 14/874,054, filed Oct. 2, 2015, Vinciarelli.
Amendment after Allowance Pursuant to 37 C.F.R. §1.312 in U.S. Appl. No. 13/044,063, dated Mar. 3, 2015, 17 pages.
AN2738, Application Note AN2738, "L6390 half-bridge gate driver," STMicroelectronics, Aug. 2009.
Burton et al., "FIVR—Fully Integrated Voltage Regulators on 4th Generation Intel® CoreTM SoCs," In Applied Power Electronics Conference and Exposition (APEC), 2014 Twenty-Ninth Annual IEEE, Mar. 16, 2014, 432-439.
Cao et al., "A Family of Zero Current Switching Switched-Capacitor DC-DC converters," Applied Power Electronics Conference and Exposition (APEC), 2010 Twenty-Fifth Annual IEEE, Mar. 18, 2010.
Cao et al., "Zero-Current-Switching Multilevel Modular Switched-Capacitor DC-DC Converter" IEEE Transactions on Industry Applications, 46(6):2536-2544, Sep. 2010.
DiBene II et al., "A 400 Amp Fully Integrated Silicon Voltage Regulator with in-die Magnetically Coupled Embedded Inductors," retrieved from http://www.psma.com/sites/default/files/uploads/tech-forums-nanotechnology/resources/400a-fully-integrated-silicon-voltage-regulator.pdf, retrieved on Aug. 3, 2016, 25 pages.
European Office Action in European Application No. 16173089.0, dated Apr. 10, 2017, 2 pages.
Extended Search Report in European Application No. 16173089.0, dated Feb. 14, 2017, 8 pages.
ISL6210, Datasheet ISL6210, "Dual Synchronous Rectified MOSFET Drivers," Intersil Americas Inc., Dec. 2008.
Miller, "12V PowerStage in Embedded Die System-in-Package," APEC 2015, 33 pages.
Notice of Allowance in U.S. Appl. No. 13/044,063, dated Feb. 20, 2015, 15 pages.
Notice of Allowance in U.S. Appl. No. 13/044,063, dated Jun. 5, 2015, 11 pages.
Notice of Allowance in U.S. Appl. No. 14/682,187, dated Jan. 17, 2017, 22 pages.
Notice of Allowance in U.S. Appl. No. 15/091,346, dated Aug. 13, 2018, 8 pages.
Notice of Allowance in U.S. Appl. No. 15/091,346, dated May 21, 2018, 9 pages.
Notice of Allowance in U.S. Appl. No. 15/616,288, dated Dec. 11, 2018, 9 pages.
Office Action in U.S. Appl. No. 13/044,063, dated May 23, 2014, 24 pages.
Okudaira and Matsuse, "A New Quasi-Resonant Inverter With Two-way Short-circuit Switch Across a Resonant Capacitor," Power Conversion Conference 2002, 2002, 1496-1501.
Oraw et al., "Load Adaptive, High Efficiency, Switched Capacitor Intermediate Bus Converter," Telecommunications Energy Conference, IEEE 2007, pp. 628-635 Sep. 30-Oct. 4, 2007.
Reply to Action of May 23, 2014 in U.S. Appl. No. 13/044,063, dated Oct. 24, 2014, 39 pages.
Seeman et al., "Analysis and optimization of switched-capacitor dc-dc converters," Power Electronics, IEEE Transactions on, vol. 23, pp. 841-851, Mar. 2008.
Supplemental Notice of Allowability in U.S. Appl. No. 13/044,063, dated Apr. 20, 2015, 5 pages.
Watson, "New Techniques in the Design of Distributed Power System," Dissertation, 1998, 32 pages.
Yeung et al., "Generalised analysis of switched-capacitor step-down quasi-resonant converter," Electronics Letters, vol. 38, pp. 263-264, 2002.
Yeung et al., "Zerocurrent switching switched-capacitor quasiresonant step-down converter," Electric Power Applications, IEE Proceedings –, vol. 149, pp. 111-121, 2002.

* cited by examiner

METHOD AND APPARATUS FOR DELIVERING POWER TO SEMICONDUCTORS

CROSS-REFERENCE TO RELATED APPLICATION

This application is a divisional application of U.S. patent application Ser. No. 15/616,288, filed on Jun. 7, 2017, which is a continuation-in-part of, and claims priority to, U.S. patent application Ser. No. 15/091,346, filed on Apr. 5, 2016. The above applications are incorporated by reference in their entirety.

FIELD OF THE INVENTION

This invention relates to the field of switching power supplies and more particularly to power converters that supply power to large semiconductor devices such as processors and ASICs.

BACKGROUND

Many large scale semiconductors require high current, e.g. 100 A or more, at low voltages, e.g. 1V, or less, dissipate large amounts of power, challenging packaging technologies to accommodate power, thermal, and signal demands. Certain microprocessors incorporate on-silicon switching regulators which because of design tradeoffs occupy precious silicon real estate and inefficiently convert power. Resonant switching power converters may be used as fixed ratio current multipliers in power conversion systems to provide high current at a low voltage.

SUMMARY

In one aspect, in general, a method of supplying power received from an input source at an input voltage to circuitry on one or more semiconductor chips mounted in a semiconductor package at a DC output voltage is provided. The method includes providing a driver circuit for deployment outside the semiconductor package having an input for receiving power from the source, circuitry adapted to drive a transformer, and a driver output; providing one or more output circuits for deployment in the semiconductor package, each output circuit including a printed circuit board, a power transformer including a first winding and a second winding, an input connected to the first winding for receiving AC power from the driver output, a rectification circuit connected to the second winding for rectifying power received from the transformer, and an output connected to the rectification circuit for supplying DC power to the one or more semiconductor chips; providing a power bus for carrying AC power from the driver output to the input of each of the one or more output circuits in the semiconductor package; operating the driver circuit to drive the transformer in a series of converter operating cycles, each converter operating cycle characterized by two power transfer phases of essentially equal duration during which one or more switches in the driver circuit are ON and power is transferred from the input to the output via the transformer; and deploying the driver circuit at a first location outside of the semiconductor package. Power is supplied to the semiconductor package by the driver circuit at a bus voltage that is a multiple, X, times greater than a load voltage required by the one or more semiconductor chips.

In another aspect, in general, an apparatus includes a semiconductor package including a substrate having a plurality of interface connections connected to at least one surface of the package substrate and one or more semiconductor chips mounted to the substrate, the interface connections adapted for electrical connection to a system board; one or more output circuits housed in the semiconductor package, each output circuit including a printed circuit board, a power transformer including a first winding and a second winding, an input connected to the first winding for receiving AC power, a rectification circuit connected to the second winding for rectifying power received from the transformer, and an output connected to the rectification circuit for supplying DC power to the one or more semiconductor chips; and a power bus connected to selected interface connections for carrying AC power at a bus voltage from the system board to the input of each of the one or more output circuits in the semiconductor package. The bus voltage is a multiple, X, times greater than a voltage required by the one or more semiconductor chips.

In another aspect, in general, a method of packaging a semiconductor die includes providing a substrate for mounting to a bottom surface of the semiconductor die; providing a lid to extract heat from a top surface of the semiconductor die; providing one or more output circuits having a bottom surface mounted to the substrate for supplying power to the semiconductor die; and conducting heat from the bottom of the semiconductor die, into the substrate, from the substrate into the bottom of the one or more output circuits, out of the top of the one or more output circuits, into the lid.

In another aspect, in general, an apparatus includes a semiconductor package including a substrate having a plurality of interface connections connected to at least one surface of the package substrate and one or more semiconductor chips mounted to the substrate, the interface connections adapted for electrical connection to a system board; and one or more power conversion circuits housed in the semiconductor package, each power conversion circuit including an inductive component for converting power from an input at an input voltage to an output at an output voltage for delivery to the one or more semiconductor chips, the inductive component having a magnetically permeable core having an effective permeability of at least 25. The ratio of input voltage to output voltage is fixed, subject to a series resistance, and is at least 5.

In another aspect, in general, an apparatus includes a semiconductor package including a substrate having a plurality of interface connections connected to at least one surface of the package substrate and one or more semiconductor chips mounted to the substrate, the interface connections adapted for electrical connection to a system board; and one or more power conversion circuits housed in the semiconductor package, each power conversion circuit including at least one switch, a switch controller, and an inductive component for converting power from an input at an input voltage to an output at an output voltage for delivery to the one or more semiconductor chips, wherein the switch controller is configured to turn the at least one switch ON or OFF at essentially zero voltage. The power conversion circuit ratio of input voltage to output voltage is fixed, subject to a series resistance, and is at least 5.

In another aspect, in general, an apparatus includes a semiconductor package including a substrate having a plurality of interface connections connected to at least one surface of the package substrate and one or more semiconductor chips mounted to the substrate, the interface connections adapted for electrical connection to a system board;

and one or more power conversion circuits housed in the semiconductor package, each power conversion circuit including at least one switch, a switch controller, and an inductive component for converting power from an input at an input voltage to an output at an output voltage for delivery to the one or more semiconductor chips, wherein the switch controller is configured to turn the at least one switch ON or OFF at essentially zero current. The power conversion circuit ratio of input voltage to output voltage is fixed, subject to a series resistance, and is at least 5.

In another aspect, in general, an apparatus includes a semiconductor package including a substrate having a plurality of interface connections connected to at least one surface of the package substrate and one or more semiconductor chips mounted to the substrate, the interface connections adapted for electrical connection to a system board; and one or more power conversion circuits housed in the semiconductor package, each power conversion circuit including at least one switch, a switch controller, and an inductive component for converting power from an input at an input voltage to an output at an output voltage for delivery to the one or more semiconductor chips. The switch controller is configured to operate the at least one switch to limit slew rates of voltage in the converter to 5 (Vpeak/Top).

In another aspect, in general, an apparatus includes a semiconductor package including a substrate having a plurality of interface connections connected to at least one surface of the package substrate and one or more semiconductor chips mounted to the substrate, the interface connections adapted for electrical connection to a system board; and one or more power conversion circuits housed in the semiconductor package, each power conversion circuit including at least one switch, a switch controller, and an inductive component for converting power from an input at an input voltage to an output at an output voltage for delivery to the one or more semiconductor chips. The switch controller is configured to operate the at least one switch to limit slew rates of current in the converter to less than or equal to 5*(Ipeak/Top).

In another aspect, in general, a method of supplying power received from an input source at an input voltage to circuitry on one or more semiconductor chips mounted in a semiconductor package at a DC output voltage is provided. The method includes providing one or more output circuits for deployment at one or more locations near or adjacent to the semiconductor package, each output circuit including a printed circuit board, a power transformer including a first winding and a second winding, an input connected to the first winding for receiving AC power, a rectification circuit connected to the second winding for rectifying power received from the transformer, and an output connected to the rectification circuit for supplying DC power to the one or more semiconductor chips; providing a driver circuit for deployment at a location spaced apart from the one or more output circuits, the driver circuit having an input for receiving power from the source, circuitry configured to drive a transformer, a driver output for supplying AC power to the one or more output circuits, and circuitry configured to control the power supplied to the one or more output circuits; providing a power bus for carrying AC power from the driver output to the input of each of the one or more output circuits; operating the driver circuit to drive the transformer in a series of converter operating cycles, each converter operating cycle characterized by two power transfer phases of essentially equal duration during which one or more switches in the driver circuit are ON and power is transferred from the input to the output via the transformer; and deploying the driver circuit at a first location outside of an area immediately near or adjacent to the one or more output circuits. Power is supplied to the one or more output circuits by the driver circuit at a bus voltage that is a multiple, X, times greater than the load voltage required by the one or more semiconductor chips.

In another aspect, in general, a method of supplying power received from an input source at an input voltage to a load at a DC output voltage is provided. The method includes providing one or more current multiplier modules at one or more locations in close proximity to the load, the one or more current multiplier modules having a transformer and circuitry for supply DC power to the load; and providing a driver module at a location spaced apart from the one or more current multiplier modules, the driver module having circuitry including an input for receiving power form the input source, control circuitry for generating a controlled driver voltage, and driver circuitry for generating AC power for driving the transformer in each of the one or more current multiplier modules.

In another aspect, in general, a method of making a planar magnetic component is provided. The method includes providing a multilayer printed circuit board (PCB) including conductive features arranged on conductive layers of the PCB to form one or more windings around one or more predetermined axes; forming a hole in the PCB at each of the one or more predetermined axes to accommodate one or more core legs, wherein for each hole, an inner edge of one of the windings overlaps an edge of the hole in a lateral direction after the hole is formed; assembling a first magnetically permeable plate to a first surface of the PCB covering a selected one or more of the holes at the one or more predetermined axes; assembling a second magnetically permeable plate to a second surface of the PCB covering the selected one or more of the holes at the one or more predetermined axes; filling the selected one or more of the holes with at least one of a magnetically permeable fluid or powder; and sealing the selected one or more holes to prevent the at least one of magnetically permeable fluid or powder from escaping.

In another aspect, in general, an apparatus includes a planar magnetic structure including a multilayer printed circuit board (PCB) having a first surface, a second surface, and conductive features arranged on conductive layers of the PCB to form one or more windings around one or more predetermined axes; a hole in the PCB at each of the one or more predetermined axes, each hole having an inner edge aligned with an inner circumference of one of the windings; a first magnetically permeable section affixed to the first surface of the PCB covering a selected one or more of the holes; a second magnetically permeable section affixed to the second surface of the PCB covering the selected one or more of the holes; and at least one of a magnetically permeable fluid or powder disposed in the selected one or more of the holes. The at least one magnetically permeable fluid or powder is contained within the selected one or more holes.

In another aspect, in general, a method of supplying power received from an input source at an input voltage to one or more circuit loads on one or more semiconductor chips mounted in a semiconductor package at a DC output voltage is provided. The method includes providing one or more driver circuits for deployment outside the semiconductor package, each having an input for receiving power from the source and a driver output; providing one or more output circuits for deployment in or near the semiconductor package, being connected to receive power from the driver circuit at a driver voltage; arranging the output circuits to form a plurality of output rails configured to supply power at a plurality of respective unique rail voltages to the one or more semiconductor chips; configuring each output rail to provide a rail voltage that is greater than or less than an adjacent rail voltage by at least a predetermined minimum differential; configuring the output circuits to provide the rail voltages as a function of the driver voltage; providing one or more rail selection circuits on the one or more semiconductor chips, each having inputs connected to the output rails and an output connected to deliver power to a respective load at a respective load voltage, each rail selection circuit having a plurality of rail switches connected to provide a selectable path for current flow from a selected one of the rails to the output; providing a power bus for carrying power from the driver output to the input of each of the one or more output circuits; and deploying the driver circuit at a first location outside of the semiconductor package; wherein each rail selection circuit is operative to enable a respective rail switch to conduct current from selected output rail to its respective output.

In another aspect, in general, a method of supplying power received from an input source at an input voltage to one or more circuit loads on one or more semiconductor chips mounted in a semiconductor package at a DC output voltage is provided. The method includes providing one or more driver circuits for deployment outside the semiconductor package, each driver circuit having an input for receiving power from the source, and a driver output having a first terminal driven by a switching node and a second terminal referenced to a voltage potential within a predetermined range of a common terminal; deploying the driver circuit at a first location outside of the semiconductor package; providing one or more output circuits for deployment in or near the semiconductor package for supplying power to the one or more semiconductor chips, at least one of the output circuits including a transformer having a primary winding adapted for connection to the first and second terminals of the driver output and a secondary winding; providing a power bus for carrying power from the first and second terminals of the driver output to the primary winding; and providing a first capacitor connected to block direct current between the switching node and the primary winding; wherein driver circuit is adapted to drive the transformer with an average voltage of essentially zero volts; wherein the one or more output circuits are adapted to receive power from the driver circuit at a peak-to-peak bus voltage, Vpeak, and supply power to the one or more semiconductor chips at a load voltage, Vload, wherein Vpeak is a multiple, X, of Vload and X is at least six.

In another aspect, in general, a method of supplying power received from an input source at a source voltage to circuitry on a semiconductor chip mounted in a semiconductor package at a DC load voltage is provided. The method includes performing a first power conversion outside of the semiconductor package, the first conversion including receiving power from the source at the source voltage, making a voltage adjustment, and delivering power from a first output to the semiconductor package at a package voltage; conducting power from the first output through a portion of the semiconductor package to a point of load (POL) circuit located within the semiconductor package; performing a second power conversion in the POL circuit, the second power conversion including receiving the conducted power, making a second voltage adjustment, and delivering power to the semiconductor chip at a chip voltage; and performing a third power conversion in circuitry located on the semiconductor chip, the third conversion including receiving power from the POL circuit, making a third voltage adjustment, and delivering power at the load voltage to circuitry on the semiconductor chip; wherein the package voltage is at least, 5, times greater than the load voltage.

In another aspect, in general, a method of supplying power received from an input source at a source voltage to circuitry on a semiconductor chip mounted in a semiconductor package at a DC load voltage is provided. The method includes performing a first power conversion outside of the semiconductor package, the first conversion including receiving power from the source at the source voltage, making a voltage adjustment, and delivering power from a first output to the semiconductor package at a package voltage; conducting power from the first output through a portion of the semiconductor package to a point of load (POL) circuit located within the semiconductor package; performing a second power conversion in the POL circuit, the second power conversion including receiving the conducted power, making a second voltage adjustment, and delivering power to the semiconductor chip at a chip voltage; and performing a third power conversion in circuitry located on the semiconductor chip, the third conversion including receiving power from the POL circuit, making a third voltage adjustment, and delivering power at the load voltage to circuitry on the semiconductor chip; wherein the package voltage is at least, 5, times greater than the load voltage.

In another aspect, in general, a method of supplying power received from an input source at a source voltage to circuitry on a semiconductor chip mounted in a semiconductor package at a DC load voltage is provided. The method includes performing a first power conversion outside of the semiconductor package, the first conversion including receiving power from the source at the source voltage, making a voltage adjustment, and delivering power from a first output to the semiconductor package at a package voltage; conducting power from the first output through a portion of the semiconductor package to a point-of-load (POL) circuit located within the semiconductor package and outside of the semiconductor chip; performing a second power conversion in the POL circuit, the second power conversion including receiving the conducted power, making a second voltage adjustment, and delivering power to the semiconductor chip at a chip voltage; and performing a third power conversion in circuitry located on the semiconductor chip, the third conversion including receiving power from the POL circuit, making a third voltage adjustment, and delivering power at the load voltage to circuitry on the semiconductor chip; wherein the package voltage is at least, 5, times greater than the load voltage.

In another aspect, in general, an apparatus includes a semiconductor package having one or more semiconductor chips, each semiconductor chip comprising one or more circuit loads; one or more driver circuits disposed outside of the semiconductor package, each driver circuit having a driver input and a driver output, in which the driver input is configured to receive power from an input source at an input voltage; one or more output circuits disposed inside or in a vicinity of the semiconductor package and configured to receive power from the driver circuit at a driver voltage, in which the output circuits are configured to form a plurality of output rails to supply power at a plurality of respective unique rail voltages to the one or more semiconductor chips, each output rail is configured to provide a DC rail voltage that is greater than or less than an adjacent rail voltage by at least a predetermined minimum differential, and the output circuits provide the rail voltages as a function of the driver voltage; one or more rail selection circuits disposed on the one or more semiconductor chips, each having inputs electrically coupled to the output rails and an output electrically coupled to deliver power to a respective load at a respective load voltage, each rail selection circuit having a plurality of rail switches electrically coupled to provide a selectable path for current to flow from a selected one of the output rails to the respective output; and a power bus configured to carry power from the driver output to the input of each of the one or more output circuits.

In another aspect, in general, an apparatus includes a semiconductor package having one or more semiconductor chips, each semiconductor chip having one or more circuit loads; a first power conversion stage disposed outside of the semiconductor package and configured to perform a first power conversion, in which the first power conversion stage is configured to receive power from an input source at a source voltage, make a voltage adjustment, and deliver power from a first output to the semiconductor package at a package voltage; a power bus configured to conduct power from the first output through a portion of the semiconductor package to a point-of-load (POL) circuit located within the semiconductor package; the POL circuit configured to perform a second power conversion, in which the POL circuit is configured to receive the conducted power, make a second voltage adjustment, and deliver power to at least one of the semiconductor chips mounted in the semiconductor package at a chip voltage; and a third power conversion stage located on the semiconductor chip and configured to perform a third power conversion, in which the third power conversion stage is configured to receive power from the POL circuit, make a third voltage adjustment, and deliver power at a load voltage to at least one circuit load on the semiconductor chip, and the package voltage is at least 5 times greater than the load voltage.

The details of one or more embodiments of the invention are set forth in the accompanying drawings and description below. Other features, objects, and advantages of the invention will be apparent from the description and drawings, and from the claims.

DESCRIPTION OF DRAWINGS

Like references symbols in the various drawings indicate like elements.

DETAILED DESCRIPTION

In contemporary electronic systems, space is at a premium on customer circuit boards, e.g. on a circuit board near a processor. Additionally, thermal management considerations place limits on the efficiency and power dissipation of power supplies at, or near, the point of load. Many very large scale integrated ("VLSI") semiconductor dies such as central processing units ("CPU"), graphics processing units ("GPU"), and application specific integrated circuits ("ASIC") are mounted to a multilayer ceramic substrate which translates the electrical connections from the die to larger connections suitable for interfacing with a customer motherboard. As feature sizes decrease and transistor counts increase, so too do the power supply current requirements for such large chips. Current requirements for a typical CPU can easily exceed 200 amps creating challenges for the package and system designers to efficiently supply such high currents. For example, power connections between the component package (such as a chip carrier or substrate or other package in or on which the semiconductor die is mounted)

and the printed circuit board (PCB) on which the package is mounted may demand a large number of connector pins, leads, solder bumps, etc., to carry very high currents challenging package designers to accommodate both power and signal requirements. In many cases the large number and high frequency demands of signals may limit the maximum voltage, e.g. the interlayer breakdown voltage, to which the substrate or package may be subjected, in some cases as low as a few volts, further challenging power connections to and within the package or substrate.

A Factorized Power Architecture well suited for supplying power to low voltage high current loads is described in Vinciarelli, *Factorized Power with Point of Load Sine Amplitude Converters*, U.S. Pat. No. 6,975,098, issued Dec. 13, 2005 (the "Micro FPA Patent") and U.S. Pat. No. 6,984,965, issued Jan. 10, 2006 (the "FPA Patent") (both assigned to VLT, Inc. of Sunnyvale, Calif., and the entire disclosure of each patent is incorporated herein by reference). Power converters which function as DC-to-DC transformers called Voltage Transformation Modules ("VTM") and Sine Amplitude Converters ("SAC") which have a transfer function approximating $Vo=K_{VTM}*Vin-Io*R_{VTM}$ are described in Vinciarelli, *Factorized Power with Point of Load Sine Amplitude Converters*, U.S. Pat. No. 6,930,893, issued Aug. 16, 2005 (the "SAC Patent") and in Vinciarelli, *Point of Load Sine Amplitude Converters and Methods*, U.S. Pat. No. 7,145,786, issued Dec. 5, 2006 (the "POL SAC Patent") (both assigned to VLT, Inc. of Sunnyvale, Calif., the entire disclosure of each patent is incorporated herein by reference).

I. In-Package Power Conversion Topologies

A. Fault-Tolerant Topology

Figure 5:
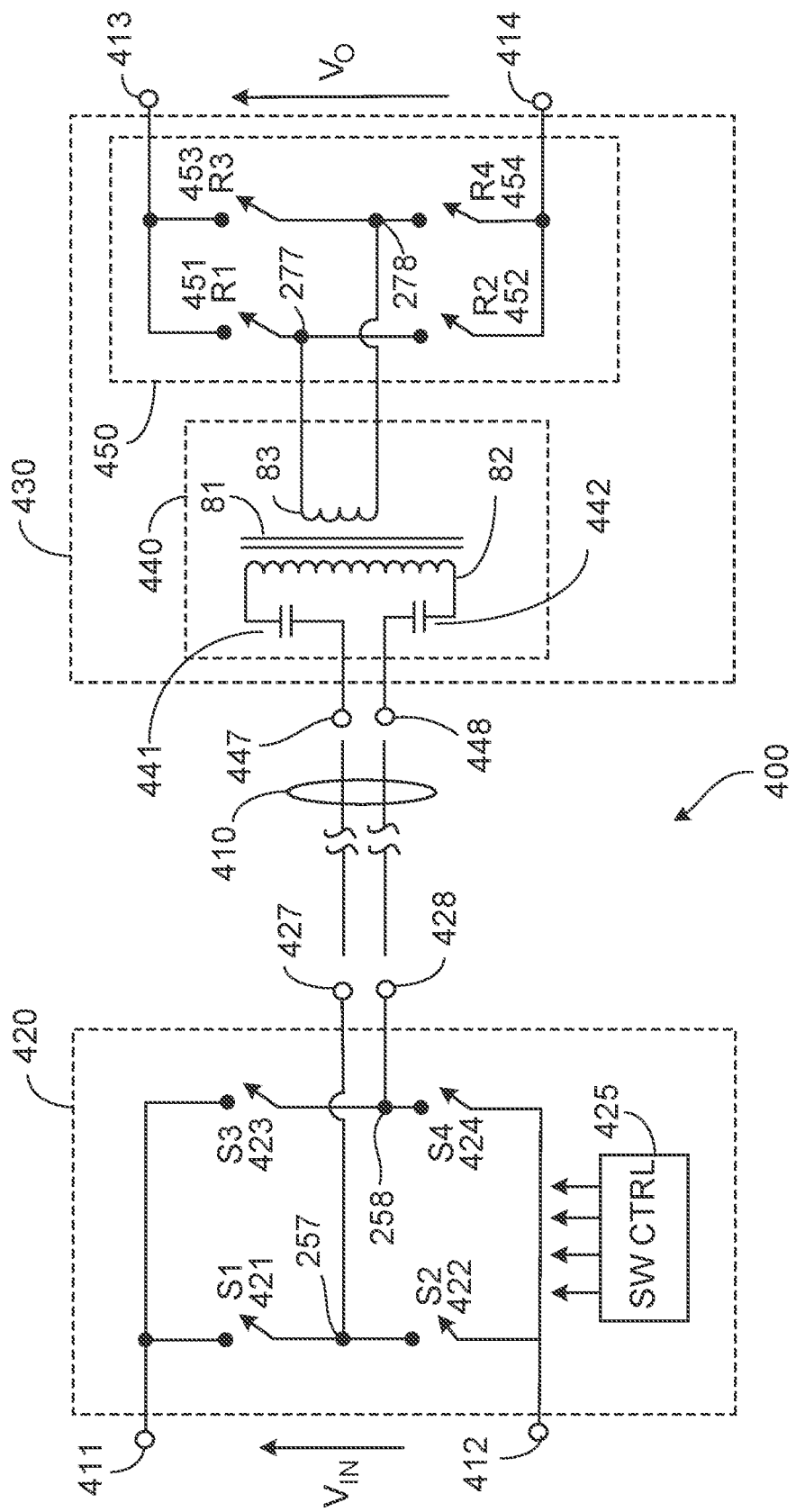
FIG. 5 shows a schematic drawing of a first modular power converter based on the SAC topology.

FIG. 5 is a replica of FIG. 14 from U.S. Pat. No. 9,112,422, issued Aug. 18, 2015, which is incorporated herein by reference in its entirety (hereinafter the "FT Patent"). In FIG. 5, a power converter 400 is shown including a driver 420 connected to drive one or more point-of-load ("POL") current multiplier circuits 430 having inputs 447, 448 connected to the driver outputs 427, 428 via an AC power bus 410. The driver 420 may comprise a full-bridge fault-tolerant input circuit such as input circuit 250 of FIG. 11 in the FT Patent and a switch controller 425 similar to the switch controller described in connection with FIG. 11 of the FT Patent.

The POL circuit 430 may include a transformer circuit 440 and a rectification circuit 450. The transformer circuit 440 may include none, one, or both, of resonant capacitors 441, 442 shown in FIG. 5 connected to the primary winding 82 of transformer 81. The secondary winding may be connected to a full-bridge fault-tolerant rectification circuit 450 as shown in FIG. 5 and described in the FT Patent. The full-bridge fault-tolerant rectification circuit 450 may use switches, R1, R2, R3, R4, operated as rectifiers in the manner described in the FT Patent in connection with output circuit 100 of FIG. 3 (of the FT Patent) and may preferably employ the common-source synchronous rectifiers described in connection with FIGS. 7 and 8 (of the FT Patent). Note that a simplified symbol is used in FIG. 5 for switches S1-S4 and R1-R4 (instead of the enhancement mode MOSFET symbols used, e.g. in FIGS. 2-4, 7, 8, 11 of the FT Patent) in which the arrow indicates the direction of current flow through the intrinsic body drain diode when the switch is open.

As its name implies, the POL circuit 430 (FIG. 5) may be designed to be deployed as close to the point of load, where space and thermal requirements are stringent, as possible. Because the driver circuit 420 does not need to be close to the point of load, it may be deployed elsewhere, away from the point of load, reducing the space required by the POL circuitry and reducing the power dissipation in proximity to the load. One benefit of removing the driver circuitry from the POL is that a larger transformer structure and array of output switches (R1-R4) may be used in the POL circuit thereby improving overall converter efficiency and further reducing dissipation at the POL. Similarly, larger input switches (S1-S4) may be used in the driver circuit to further improve overall efficiency without impacting space considerations at the POL.

However counter intuitive separating the driver 420 from the POL circuitry 430 and deploying an AC bus may initially seem, closer inspection refutes such objections. For example, power carried by the AC bus 410 may be spectrally pure (sine wave) and voltage and current slew rates substantially lower than those typically found in other switching power converter topologies, such as buck and multiphase buck converters, and even in the signal paths of computer circuitry, reducing concerns about noise and electromagnetic emissions.

Figure 8:
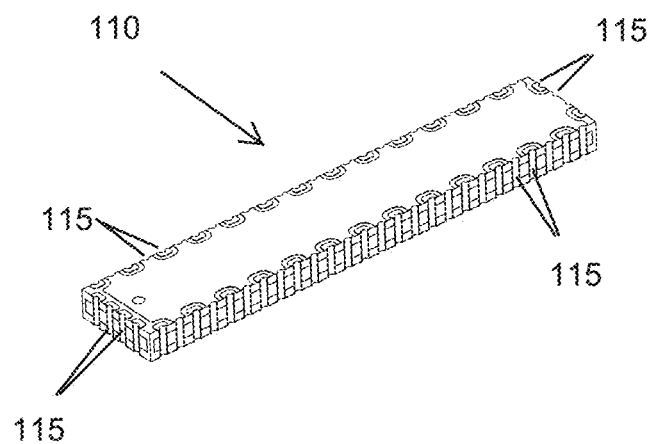
FIG. 8 shows an isometric view of an output circuit.
Figure 6:
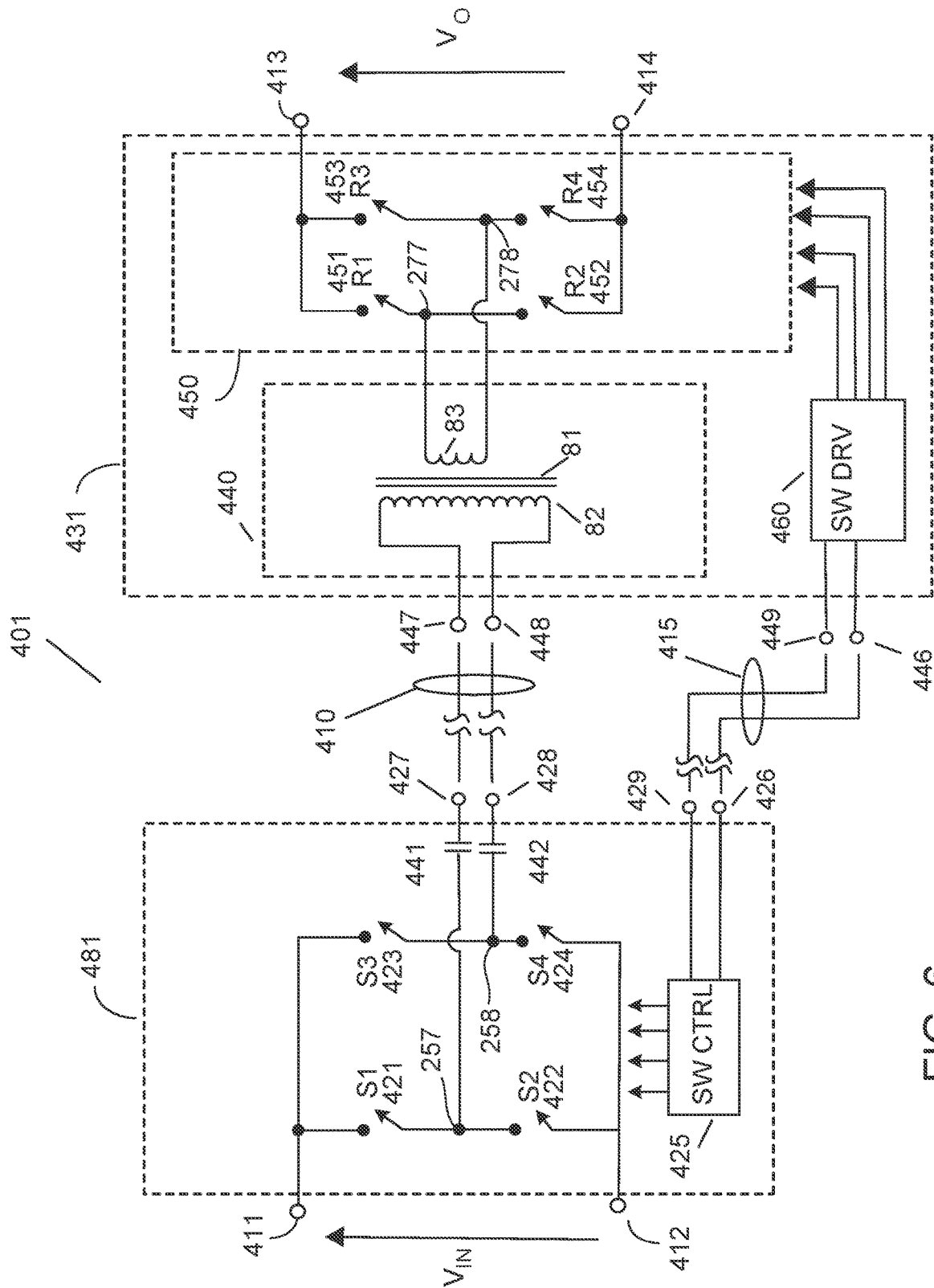
FIG. 6 shows a schematic drawing of a second modular power converter based on the SAC topology.
Figure 7:
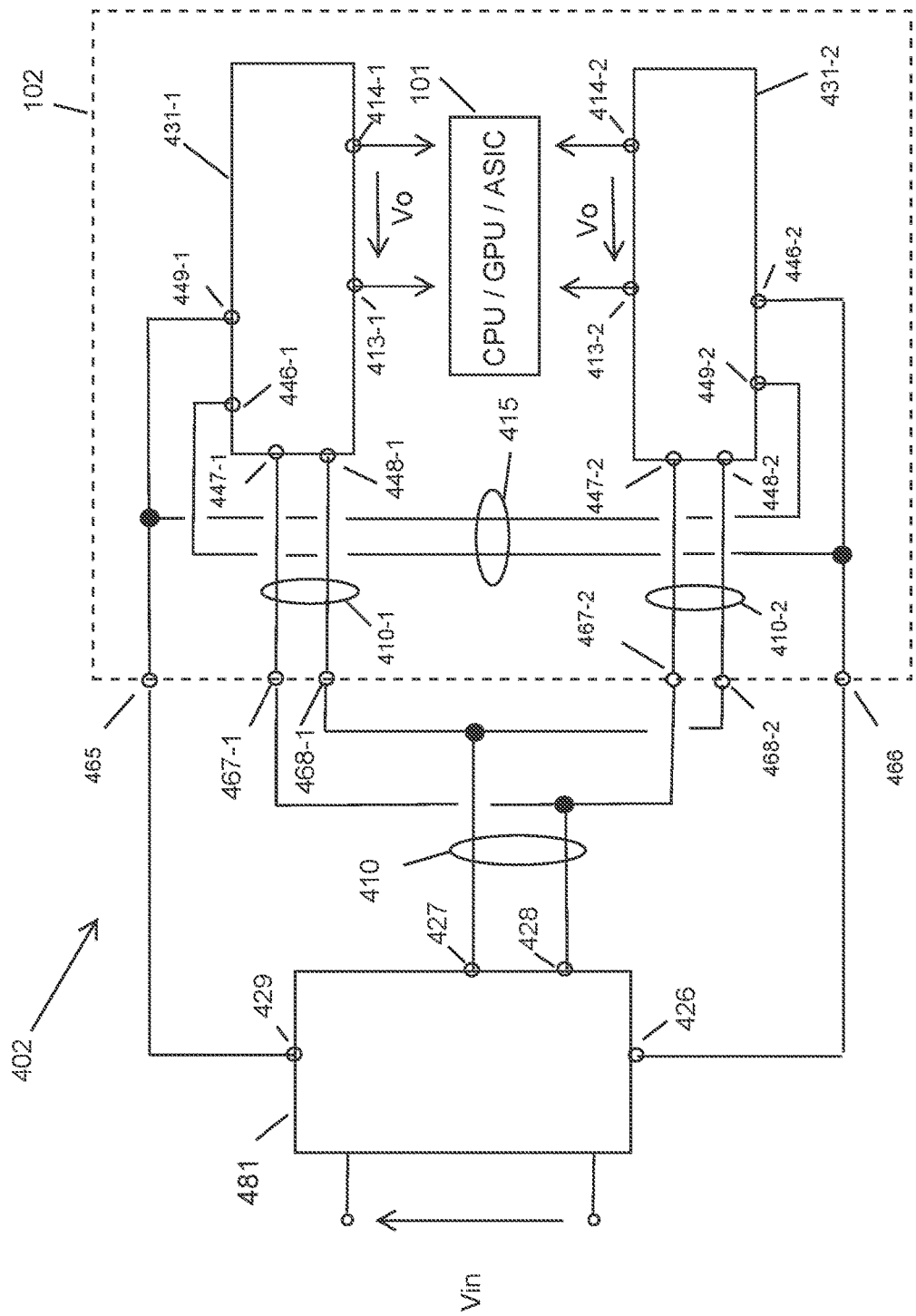
FIG. 7 shows a schematic drawing of a system including a third modular power converter with multiple output chips integrated into a semiconductor package to supply power to a large semiconductor die.

The POL circuit 430 may be enclosed as a single module, i.e. packaged for deployment as a single self-contained unit (as shown in FIGS. 5, 6, and 8), or as a multiplicity, specifically a pair, of modules for deployment as component pairs, e.g. 440 and 450, (as shown in FIGS. 1-3, 7). Because switches R1-R4, need only withstand the output voltage, the rectification circuit 450 may be integrated (with or without the control circuitry, e.g. as shown in FIGS. 7 and 8 of the FT Patent) onto a die with circuitry to which it supplies power, e.g. a processor core or an ASIC.

B. Alternative POL Topology

Referring to FIG. 6, an alternate embodiment 401 of the converter topology is shown comprising driver circuit 481 and POL circuit 431. In addition to outputs 427, 428 for driving the AC power bus 410, the driver circuit 481 as shown also includes a bias output 429 for supplying a small amount of power to operate control circuitry in the POL, and a control output 426 for supplying timing and/or control information to the POL circuit 431. A small signal bus 415 may be provided to connect driver outputs 429, 426, which may be low power and low voltage signals, to the input of the POL circuit 431.

Figure 15A:
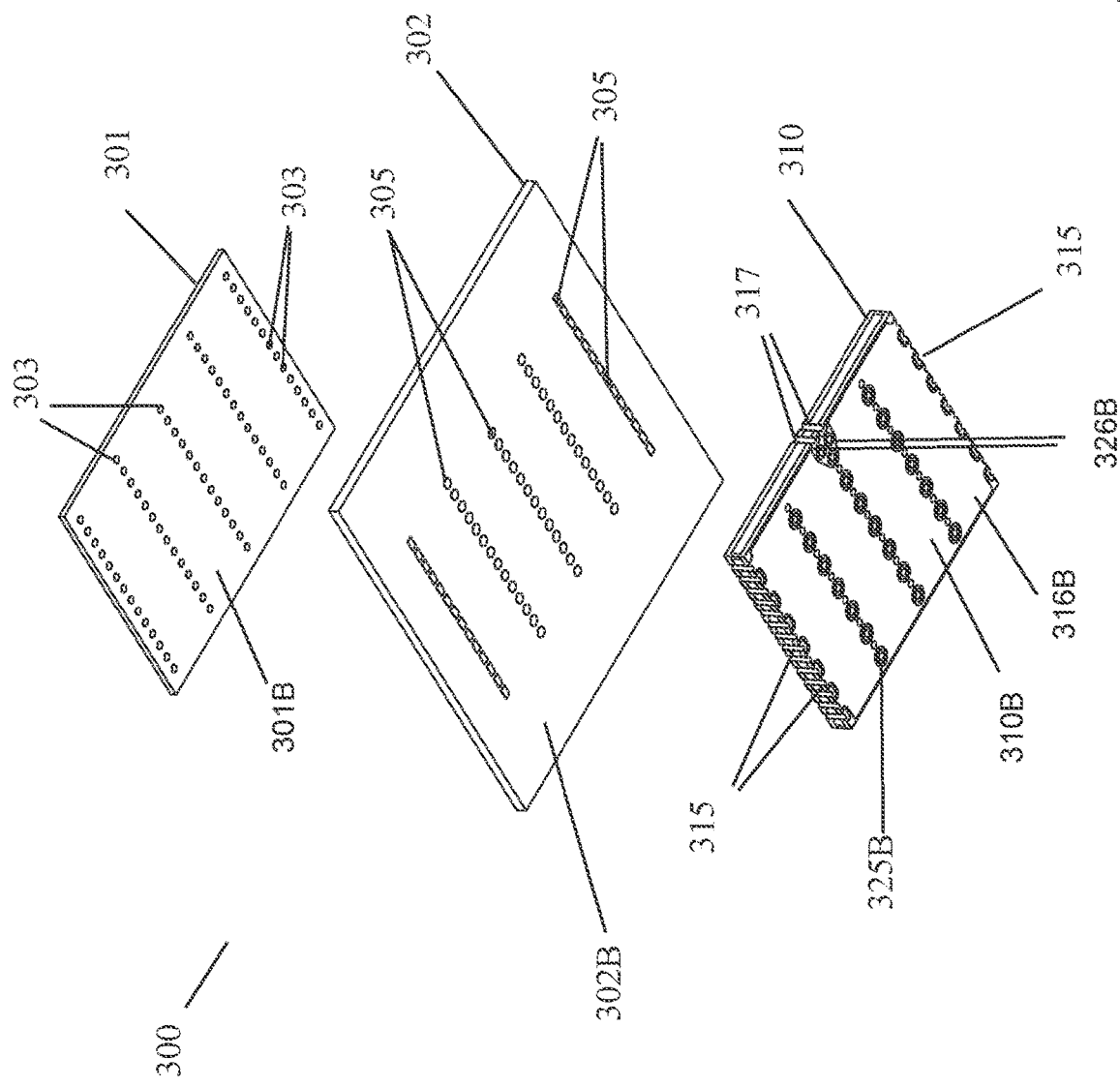
FIG. 15A and FIG. 15B show exploded bottom and top isometric views of a second semiconductor package.

An example of suitable control circuitry is described in Digital Control of Resonant Power Converters, Vinciarelli et al., U.S. Pat. No. 9,166,481, issued Oct. 15, 2015, assigned to VLT, Inc. and incorporated here by reference (the "Controller patent"), e.g. in connection with FIGS. 15 and 16. The driver may further include clamp and control circuitry to implement the clamped capacitor techniques to increase efficiency as described in Clamped Capacitor Resonant Power Converter, Vinciarelli, U.S. patent application Ser. No. 14/874,054, filed Oct. 2, 2015, now U.S. Pat. No. 9,325,247, issued on Apr. 26, 2016 (the "CSAC" patent application and patent, respectively), assigned to VLT, Inc. and incorporated here by reference. As shown in FIG. 6, the converter 401 may be partitioned with the resonant capacitors 441, 442 located in the driver module 481. Alternatively, a single resonant capacitor may be located within the driver for ease of implementing the clamp circuitry.

The POL circuit 431 as shown may include a switch driver 460 having inputs 449, 446 for receiving a bias voltage (449) and a control signal (446) from the driver circuit 481. The bias voltage provides power to operate the switch driver and the control signal provides timing information to the switch driver to synchronize operation of the secondary switches 451, 452, 453, 454 as controlled rectifiers. The secondary controller 200B shown in FIG. 15 of the Controller patent may be used for the POL switch driver 460 in FIG. 6. Although the switch driver 460 is shown in FIG. 6 with a dedicated bias supply from the driver, it may, as shown in the Controller patent, derive the power it requires to operate from the control signal or from an independent bias supply. The switch driver 460 may alternatively be co-packaged with, or integrated within, the driver circuit 481 and the secondary switches may be driven directly by the driver circuit 481, in which case the small signal bus may be used to carry gate drive signals for the secondary switches instead of the bias and timing/control signals shown.

The POL circuit 431 may be enclosed as a single module, i.e. packaged for deployment as a single self-contained unit, or as a plurality of modules for deployment as component parts, e.g. transformer module 440, secondary switches 451-454, and driver circuit 460. Because the secondary switches 451-454 need only withstand the output voltage, the rectification circuit 450 may be integrated with driver circuitry 460 onto a single die or even on the same die as the circuitry to which it supplies power, e.g. a processor core, such as a GPU, CPU, or ASIC.

C. Single-Driver Multi-POL Topology

Referring to FIG. 7, another embodiment of the topology is shown as converter 402 including a single driver circuit 481 and a plurality of POL circuits, 431-1, 431-2. The driver circuit 481 and POL circuits 431-1, 431-2 may be the same as driver circuit 481 and POL circuit 431 shown in FIG. 6, respectively. The converter 402 may include an AC bus 410 connected to outputs 427, 428 of driver circuit 481 and a small signal bus 415 (low power, low voltage) connected to the bias 429 and control 426 outputs of the driver 481 for establishing the requisite connections to each POL circuit 431-1, 431-2.

The POL circuits may be connected to operate with their outputs 413, 414 connected in parallel for low voltage loads such as a CPU, GPU, or ASIC 101. Alternatively, inputs to the POL circuits may be connected in series for lower output voltages. To summarize, power may be supplied to the POL circuits 431 by the driver 481 at a bus voltage, Vbus, that is a multiple, X, times greater than the voltage, Vload, required by the load (e.g., one or more semiconductor chips 101). The multiple X may preferably be an integer (or alternatively a non-integer rational number), preferably at least 5, or greater, e.g., 10, 20, and more preferably 40 or more. Each POL circuit may have a fixed voltage transformation ratio, K=Vout/Vin at a load current, where K may be equal to or greater than the turns ratio or step-down ratio, N, of the respective transformer in each POL circuit, depending for example on the output circuitry. The voltage transformation ratio, K, of each POL circuit may be less than or equal to the inverse of the multiple, X=Vbus/Vload, depending on the number and configuration of POL circuits supplying the load. For example, with the inputs and outputs of two or more POL circuits connected in parallel, the bus voltage, Vbus, may be set to X=1/K times the load voltage, Vload: Vbus=Vload/K. Alternatively, it may be preferable for very low output voltages, to arrange a number, M, of POL circuits with their respective inputs connected in series and outputs connected in parallel, in which case the bus voltage Vbus may be set to X=1/(M*K) times the load voltage, Vload: Vbus=Vload/(M*K). The POL circuits 431-1, 431-2 may be deployed as close as possible to the load or preferably co-packaged together with the load as shown schematically in FIG. 7 and mechanically in FIGS. 1-3.

D. Integrated Driver Regulator

Figure 9:
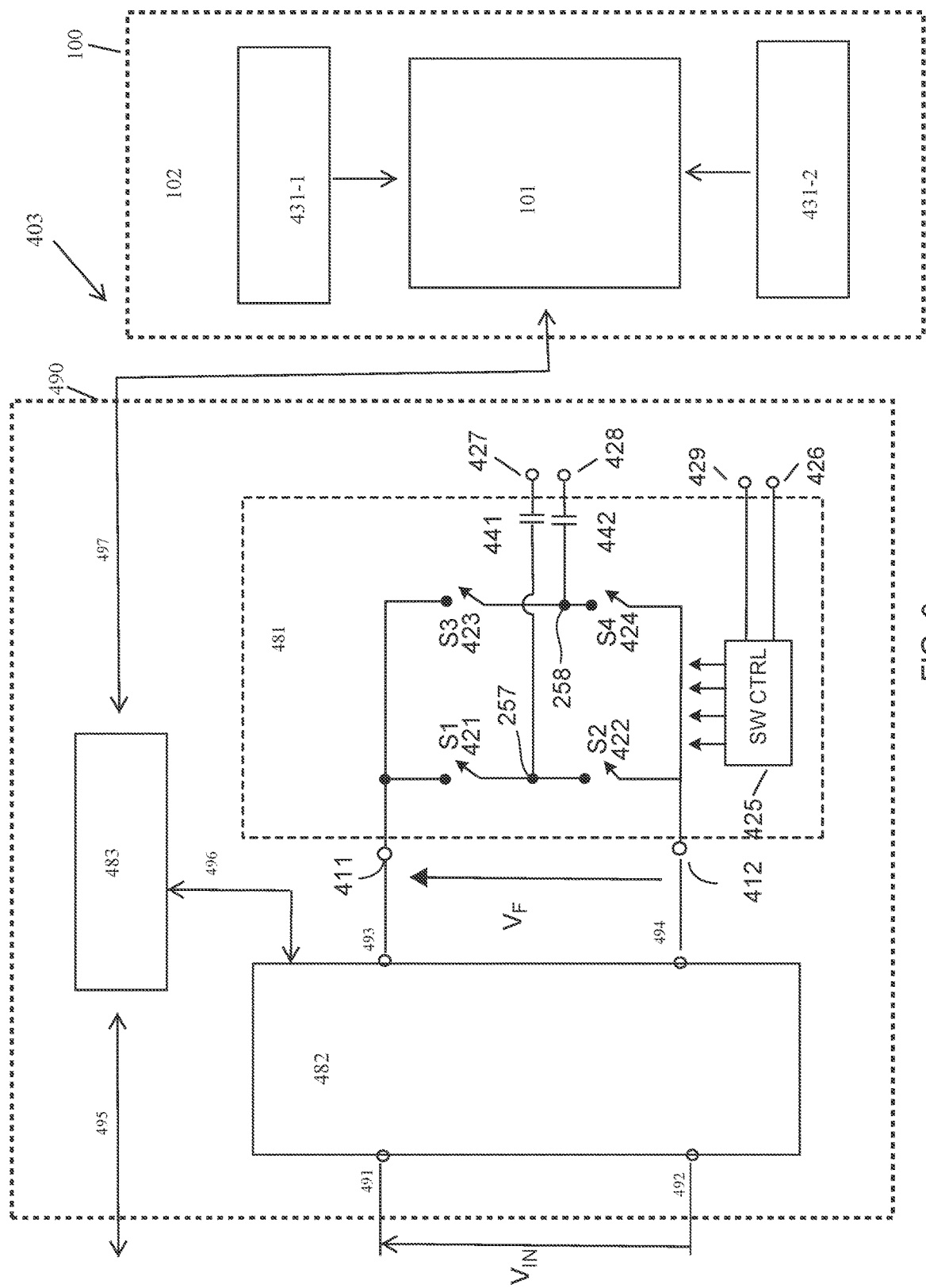
FIG. 9 shows a schematic block diagram of a system including a fourth modular power converter including an improved driver circuit.

Referring to FIG. 9, another power converter system 403 is shown including a driver 490 electrically connected to the semiconductor package 100 via connections formed by a system PCB in which the driver 490 and semiconductor package 100 may be mounted. The bias and control connections (415, FIG. 6) and AC power connections (410, FIG. 6) between the driver 490 and the substrate 102 are not shown in FIG. 9 for clarity, however, it should be understood that the desired connections, e.g. as shown in FIGS. 5-7 may be provided in the manner described above. The driver 490 as shown in FIG. 9 may include the transformer driver circuitry 481 (which may be of the type shown in FIG. 5 or 7), a power regulator circuit 482, and a supervisory circuit 483. The power regulator 482 may be used to control the voltage, $V_F$, input to the driver circuit 481 as a means of controlling the AC voltage supplied to the POL circuits 431-1, 431-2 and in turn the DC output voltage to the semiconductor die 101.

The supervisory circuit 483 may be connected to communicate with the semiconductor die 101 and optionally the POL circuits 431-1, 431-2 via a digital or analog communication bus 497 as shown in FIG. 9. Although shown as a single bus, the semiconductor die 101 and POL circuits 431 may have one or more separate buses for direct communication on the substrate 102 and the supervisory circuit 483 may have separate busses for communication with the die 101 and with the POL circuits 431, e.g. to accommodate different communication speeds and protocols. The supervisory circuit 483 may be connected to communicate with external system components via a digital or analog communication bus 495 as shown in FIG. 9, e.g. to report on conditions in the semiconductor package or power system, e.g. temperature, voltage, current, power, fault conditions, etc. or to receive commands, e.g. reset, disable, etc. For example, some CPU's require the power system to adjust the voltage supplied to the CPU in response to commands issued by the CPU, e.g. many Intel processors send voltage identification (VID) information to a voltage regulator which in turn adjusts the voltage supplied to the processor. The supervisory circuit 483 may receive such voltage commands from the semiconductor die 101 via bus 497 and issue appropriate commands to regulator 482 via digital or analog communication bus 496 to adjust the output voltage. The regulator may, in response to commands received from the supervisory circuit 483, adjust the DC output voltage of the output circuits (via the control voltage, $V_F$) to comply with the requirements of the semiconductor die 101.

An integrated dual driver module 490-4 will be described in connection with the block diagrams of FIGS. 27 and 28. In the electrical block diagram of FIG. 28, the driver 490-4 is shown including a power regulator 482 (similar to regulator 482 described in FIG. 9) supplying power to two driver circuits 481-1 and 481-2 (each similar to the driver 481 described in FIGS. 6, 7, and 9). The dual driver is similar to the integrated driver 490 described above in connection with FIG. 9, however two driver circuits, 481-1, 481-2 are connected to receive power from the regulation stage 482. As shown in FIG. 28, the regulation stage may be implemented using a single regulator 482 supplying power to both drivers 481-1, 481-2 or optionally as a plurality of regulators, 482A, 482B, as shown by the broken line 482-AB, each supplying power to its respective driver. The dual integrated driver module 490-4 may preferably be arranged with the regulation stage or stages located in the center of the package and the drivers located at each end of the package as best illustrated shown in FIG. 27.

Figure 27:
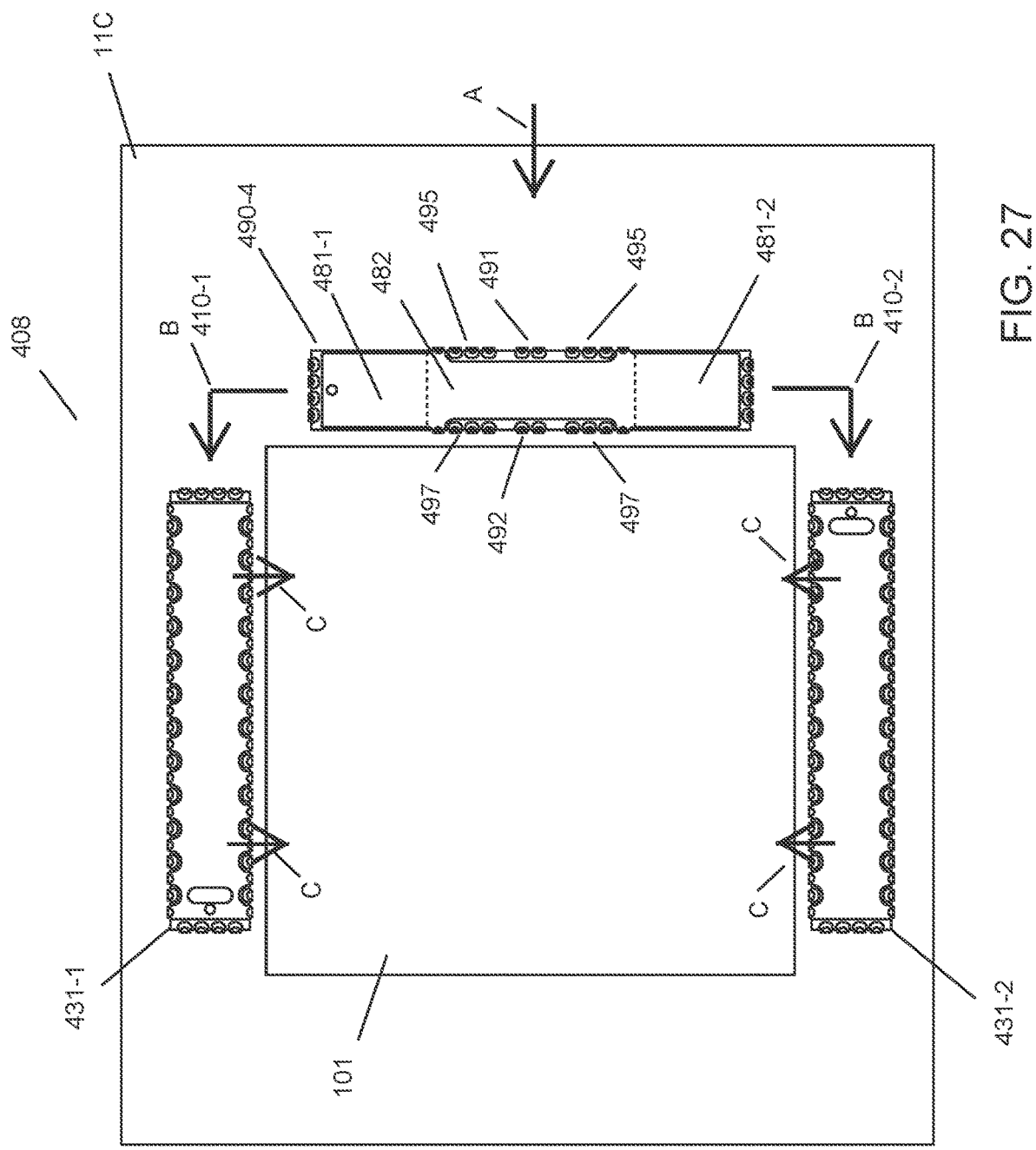
FIG. 27 shows a power system including a modified driver circuit.
Figure 28:
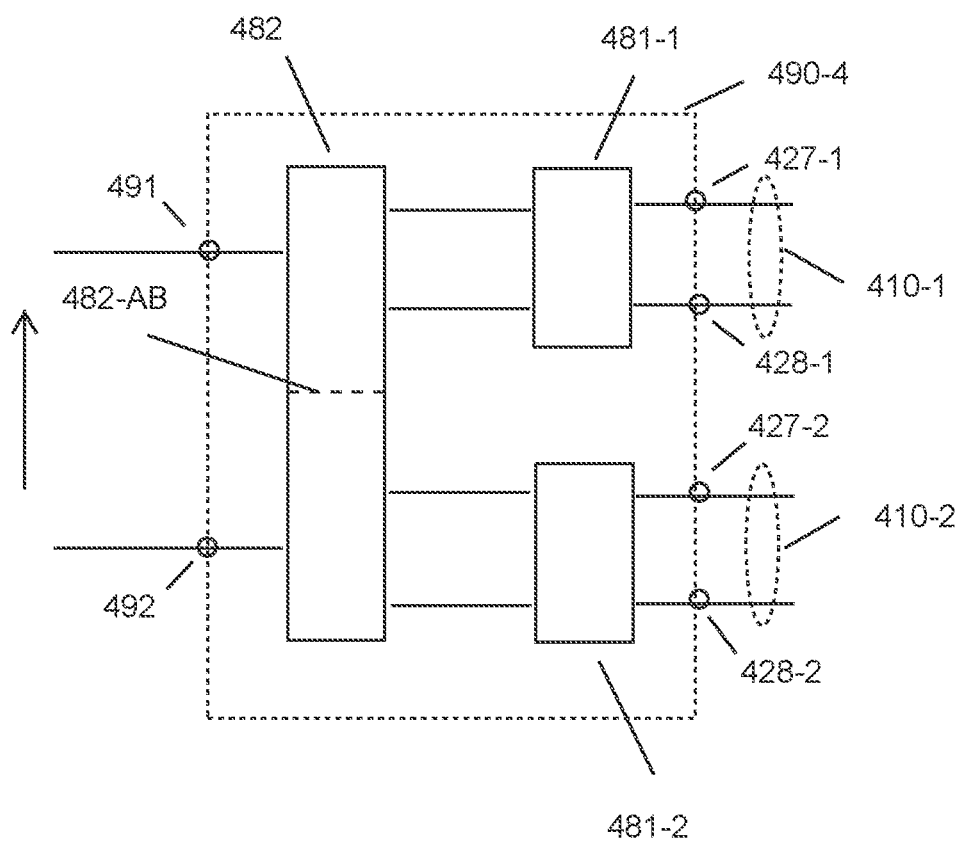
FIG. 28 shows a block diagram of a dual integrated driver module.

The dual integrated driver module 490-4 may be configured and arranged to enable efficient routing of power and control signals as shown in the system block diagram in FIG. 27. For example, the regulator power input terminals 491, 492 and system control signals 495 may be provided in the central portion, and the driver output terminal pairs, 427-1 and 428-1, 427-2 and 428-2, may be situated at the ends of the dual integrated driver module 490-4 to facilitate routing that avoids the footprint of, and the primary signal paths to and from, the die 101. For example, the power system 408 shown in FIG. 27 includes the dual integrated driver 490-4 positioned on a system board 11C along one side of a semiconductor die 101, with two POL driver circuits 431-1, 431-2 positioned along the two sides of the die 101 adjacent to the driver 490-4. The die 101 may be a large semiconductor die such as a CPU, GPU, ASIC or other large scale integrated circuit. The large arrows in FIG. 27 demonstrate a preferred power flow in the system 408 with the input power (preferably a relatively high voltage) being routed from the right side of the board 11C to the driver inputs 491, 492, i.e. to the regulator(s) 482 at the center of the dual driver 490-4 (arrow A); power flows through the dual integrated driver module 490-4 from the center (the regulator(s)) along the longitudinal axis of the module to the opposite ends (the drivers); power from the driver outputs, terminals 427-1, 428-1, 427-2, 428-2, at each of the opposite ends flows a short distance around the respective corners of the die (arrows B) to the input terminals, 447-1, 448-1, 447-2, 448-2 (e.g., see FIG. 7), at the ends of the POL output circuit modules 431-1, 431-2; and power flows out of each of the long sides of the POL output circuit modules 431-1 and 431-2 to the semiconductor die 101 (arrows C). Note that the connections (B, 410-1, 410-2) between the driver outputs and the POL output circuit inputs correspond to the high voltage bus described in connection with previous figures, e.g. 410 in FIG. 6, 410-1, 410-2 in FIG. 7, etc. The POL circuit module output terminals 413-1, 414-1, 413-2, and 414-2, supply power to the semiconductor die 101. Finally, the low power timing and control signals (bus 415 in FIGS. 6, 7, and 19) flowing through, e.g. terminals 446-1, 449-1, 446-2, 449-2, between the driver and the POL output circuits may be routed from the far ends of the POL output circuit modules 431-1, 431-2 to terminals 497 on the central die-facing portion of the module 490-4.

E. Multi-Driver Multi-Rail Topology

Figure 13:
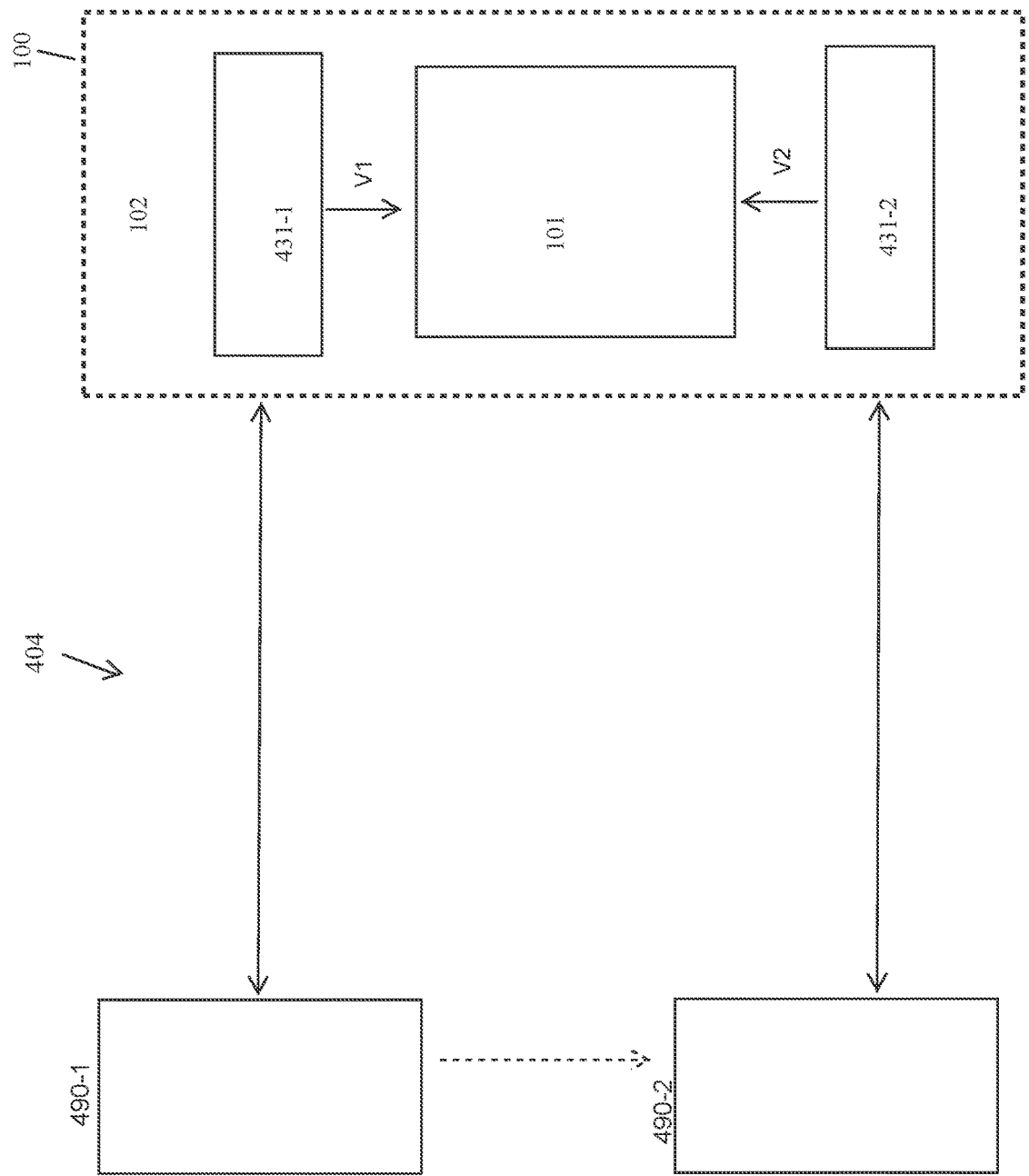
FIG. 13 shows a schematic block diagram of a system including a fifth modular power converter.

Referring to FIG. 13, another embodiment of the topology is shown as converter 404, which is configured to supply multiple voltage supply rails, V1, V2, to the semiconductor load 101. In some examples, the power converter can include output circuits that form multiple output rails configured to supply power at multiple respective rail voltages to one or more loads. In some examples, each of at least some of the output rails is configured to provide a rail voltage that is greater than or less than an adjacent rail voltage by at least a predetermined minimum differential. For examples, the rail voltages can be 1V, 1.1V, 1.2V, and 1.3V. For example, the rail voltages can be 1V, 1.2V, 1.5V, and 2V. For example, the rail voltages can be 0.66V, 0.75V, 0.86V, and 1V. Converter 404 includes two driver circuits 490-1, 490-2 for driving two POL circuits, 431-1 and 431-2, respectively. The driver circuits 490-1, 490-2 and POL circuits 431-1, 431-2, may be of the same type as driver circuit 490 (shown in FIG. 9) and POL circuits 431 (shown in FIG. 6), respectively. For simplicity, the connections between the drivers and POL circuits and semiconductor package are shown as single connections, it being understood that each may include an AC power bus, a control bus, and communications bus as described above. Preferably, the drivers may be synchronized to the same clock as shown in FIG. 13 by the broken arrow from driver 490-1 (the master) to driver 490-2 (slave). Preferably, the POL circuits 431-1 and 431-2 may be co-packaged as a single POL circuit module 431. Each driver may, in response to commands received from the semiconductor die 101, adjust the DC output voltage of the POL circuit associated with it to comply with the requirements of the semiconductor die 101. For example, driver 490-1 may adjust the output V1 of POL circuit 431-1 and driver 490-2 may adjust the output V2 of POL circuit 431-2.

F. Driver Compensation

Separation of the driver 481 and integrated controller 425 (FIG. 6) from the POL circuits 431 may introduce parasitic capacitances and inductances, which, depending upon the layout of the customer's system board, e.g. the distance between driver and POL circuits and the size and routing of the electrical connections between them, may adversely affect operation of the converter. For example, the parasitic inductance may lower (raise) the resonant frequency (period) of the resonant circuit (formed by the resonant capacitors 441, 442 and the transformer 440) which if uncompensated can lead to timing errors in the operation of the switches disrupting zero-voltage switching (ZVS) and zero-current switching (ZCS) operation, which in turn may lead to increased losses, power dissipation, and noise.

Preferably, the driver 481 may include compensation circuitry able to detect and adjust for the effects of parasitic capacitances and inductances introduced by the separation of driver and POL circuits and the vagaries of different system board layouts on converter operation. One method uses current detection, e.g. in one or more of the primary switches (e.g. switches 421, 422, 423, 424 in FIG. 6) of the driver circuit (using known techniques such as sensing the voltage across a switch while in the ON state) to detect errors in the switch timing. For example, if the compensation circuitry detects that the resonant current at the end of a power transfer interval has not returned to zero, the controller may incrementally increase the duration of the power transfer intervals until the current returns to zero or within a tolerance band of zero, e.g. 1% of the maximum resonant current. For the clamped version described in the CSAC patent application, the compensation circuitry may additionally sense the rate of change of the switch current at the end of the first resonant interval, extending it until the rate of change of the current returns to zero, or within a tolerance band of zero, or within a percentage of the maximum rate of change, e.g. 10%, 5%, or 1%. In this way, the compensation circuitry may adjust the overall timing of the converter operating cycle and/or specific aspects of the converter operating cycle, e.g. the power transfer intervals (described in the SAC, POL-SAC, and Controller patents), or the first and second resonant intervals (described in the CSAC patent application), etc.

Figure 21A:
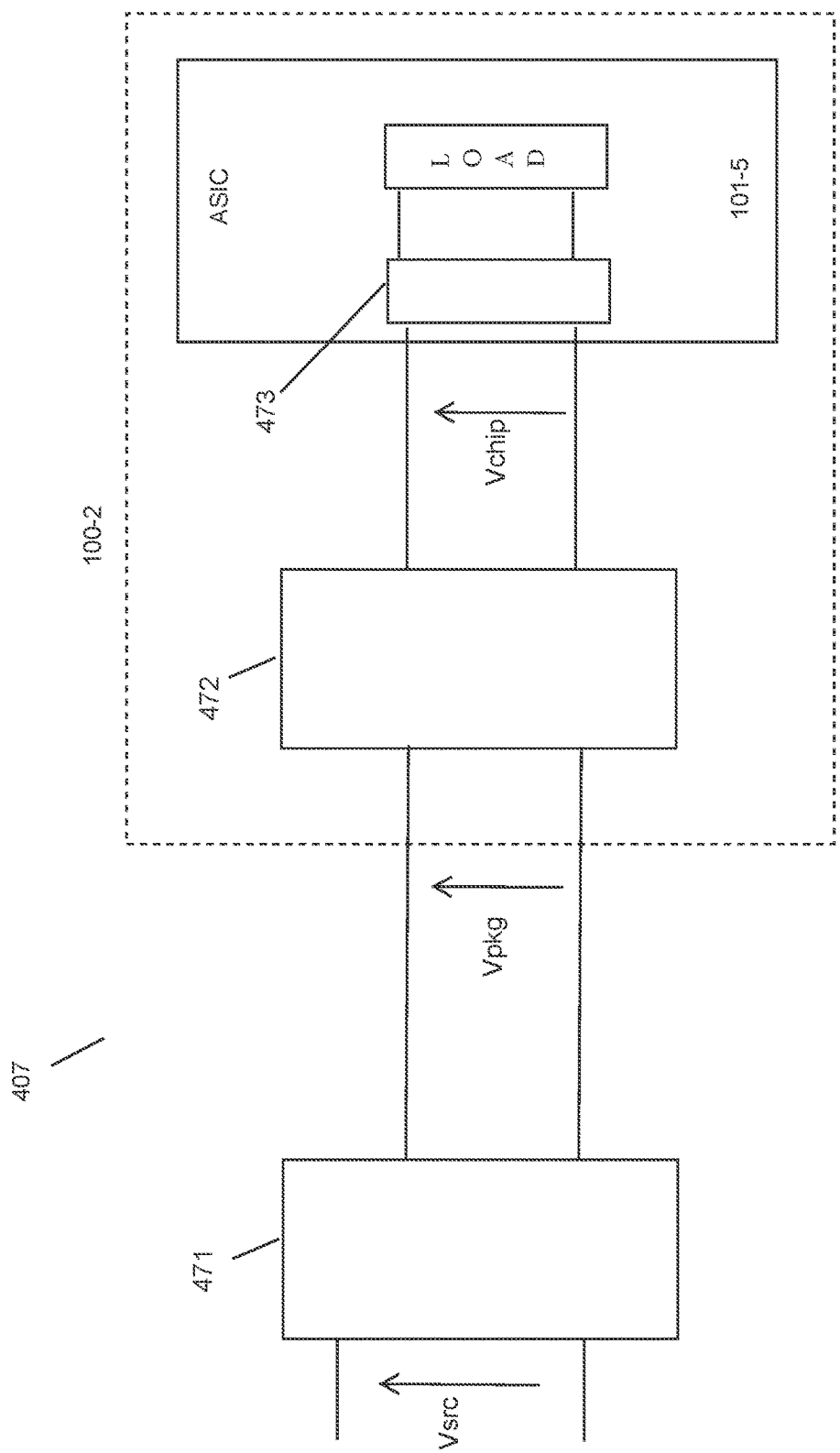
FIG. 21A shows a block diagram of a seventh modular power converter.

FIG. 21A shows a generalized block diagram of a power converter system 407 for supplying power to a load circuit on a semiconductor chip 101-5, including three power conversion stages, 471, 472, and 473. As shown, the first conversion stage, 471, is located outside of the semiconductor package 100-2, the second stage, 472, resides within the semiconductor package 100-2 with the semiconductor die 101-5 (which may be a CPU, GPU, ASIC, or other high load semiconductor device), and the third stage, 473, resides on the semiconductor die 101-5. The first conversion stage, 471, converts power received from a source (not shown) at a source voltage, Vsrc, at the input of the first conversion stage, 471, and delivers power to the semiconductor package 100-2 at a package voltage, Vpkg, preferably performing voltage transformation, e.g. reducing the voltage from a high source voltage, e.g. 48V, conducive to efficient distribution in the system, e.g. within a server rack, to a lower voltage, e.g. 25V or 6V or less, that may be appropriate for the semiconductor package or the system board on which the semiconductor package may be mounted. The second conversion stage, 472, residing within the semiconductor package 100-2, converts power received from the output of the first stage at the package voltage, Vpkg, for delivery to the semiconductor die, 101-5, at a chip voltage, Vchip, preferably further reducing the voltage by a factor of 5, 6, or more. On the semiconductor die 101-5, a third power conversion stage, 473, further processes the power for delivery to one or more loads on the die at a load voltage, $V_L$. The on-chip power processor, 473, may provide regulation and some voltage transformation, e.g. by a factor of two or less. In some examples, the source voltage can be greater than 40 VDC, the package voltage, Vpkg, can be greater than 20 VDC and the load voltage, $V_L$, can be less than 3 VDC. In some examples, the package voltage, Vpkg, can be greater than 5 VDC and the load voltage, $V_L$, can be less than 2 VDC.

The generalized converter system 407 may be better understood using the following specific examples. As a first example, consider a modified version of the system 403 (shown in FIG. 9) in which the semiconductor die 101 is replaced with a semiconductor die 101-5 that includes an internal power processing stage 473 as shown FIG. 21A. The integrated driver 490 of FIG. 9, corresponding to the first power conversion stage 471 of FIG. 21A, is located outside of the semiconductor package, receives power from the source at the input voltage, Vin, and supplies power to the semiconductor package 100 at the voltage $V_F$ (Vpkg as shown in FIG. 21A). As described above in connection with FIG. 9, the integrated driver 490 includes a regulation function in 482 and also includes a driver function 481 which generates an AC voltage for distribution to the semiconductor package 100-2. In this example, the voltage Vpkg is an AC voltage having a regulated peak value. The one or more POL output circuits, 431-1, 431-2, shown within the semiconductor package 100 in FIG. 9, corresponding to the second power conversion stage 472 situated within the semiconductor package 100-2 as shown in FIG. 21A, receive power at the higher voltage, Vpkg, and converts it down to a lower voltage for delivery to the semiconductor chip 101-5. The example of FIG. 9 may use a voltage transformation ratio of 5, 10, 20, or even 40 or greater as described above. The third power conversion stage 473 is located in the semiconductor chip as shown in FIG. 21A and may provide voltage selection and optionally additional regulation as discussed below. Although a single on-chip power processing stage 473 is shown in FIG. 21A feeding a single load, it should be appreciated that the chip may include a plurality of power processing stages feeding one or more respective loads as discussed further below.

In an alternate embodiment power system 407 (FIG. 21A) may include a fixed ratio converter for the first stage power conversion 471 providing voltage transformation and optionally galvanic isolation and regulation, converting power from a relatively high voltage bus, e.g. 48 VDC, for delivery to a lower package voltage, e.g. 5, 6, or 12 VDC, or even lower. The second stage 472 may provide voltage transformation and optionally voltage regulation and galvanic isolation, converting power from the package voltage for delivery to the lower chip voltage, Vchip. The second stage 472 preferably provides a voltage reduction of 5 or more such that Vpkg is at least 5 times greater than Vchip. Other voltage transformation factors are possible, e.g. 4, or 6, or 12, etc. In such an example, the second stage conversion may comprise a multi-phase regulator operating in buck mode. The on-chip regulation stage 473 may comprise switching or linear regulators as appropriate for the voltage and power levels and efficiencies.

G. Multi-Rail POL with On-Chip Rail Selection

Figure 21B:
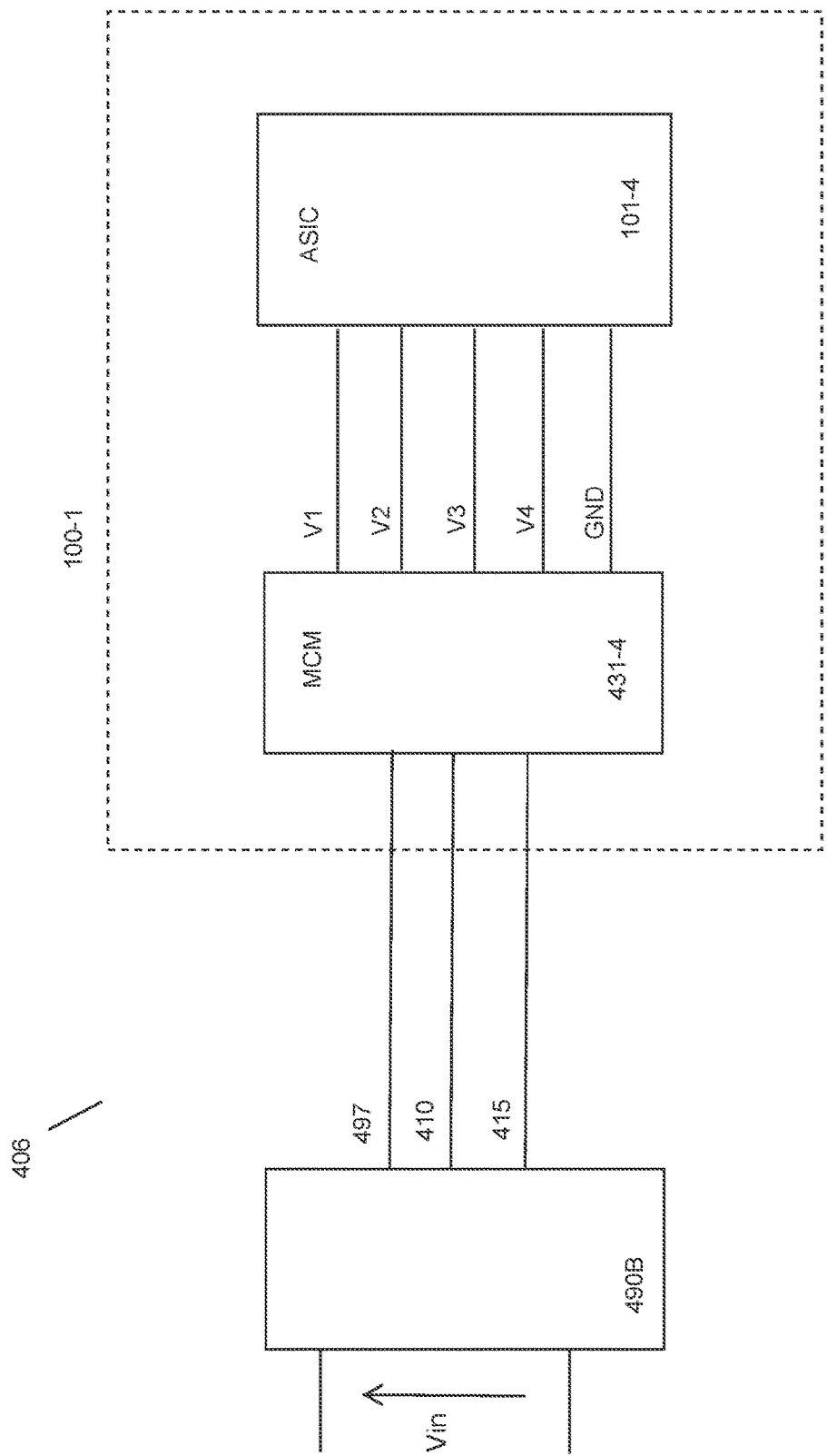
FIG. 21B shows a block diagram of a system including an eighth modular power converter including a multi-rail output point-of-load (POL) circuit co-packaged with a semiconductor die.

Referring to FIG. 21B, a power system 406 is shown, as another example of the power system 407 (FIG. 21A), including a driver circuit 490B connected to drive a multi-rail output POL circuit 431-4 having four outputs for supplying four unique voltages, V1, V2, V3, V4, to a large semiconductor die 101-4, which may be a CPU, GPU, ASIC or other semiconductor device. Although a single die is shown, the die 101-4 may comprise a plurality of chips. Power system 406 (FIG. 21B) is similar to the previous example of system 407 discussed in connection with FIG. 9 above, however, system 406 is modified to provide multiple voltages to the semiconductor chip 101-4. Although not shown in FIG. 21B, the semiconductor device 101-4 includes a third power processing stage similar to that shown in FIG. 21A to be described in greater detail in connection with FIG. 24 below. As shown, the POL circuit 431-4 and semiconductor die 101-4 may preferably be co-packaged together in semiconductor package 100-1, e.g. as described in connection with FIGS. 1-4, 10, 11. The driver 490-B may be of the type described above in connection with FIG. 9 including an AC power bus 410, a small signal bus 415 for switch timing and control signals, and an optional communication bus 497. As shown, the multi-rail output POL circuit 431-4 includes a plurality of outputs connected to supply power to the semiconductor die 101-4. In the example shown in FIG. 21B, four outputs, V1, V2, V3, V4, and a common terminal, GND, are provided for supplying power at four separate voltages, V1, V2, V3, V4, to the semiconductor die 101-4. Embodiments of the multi-rail output circuit 431-4 are described in greater detail in connection with FIGS. 22 and 23 and details of the third power conversion stage residing on the semiconductor die 101-4 are described in greater detail in connection with FIGS. 24 and 25 below.

Figure 22:
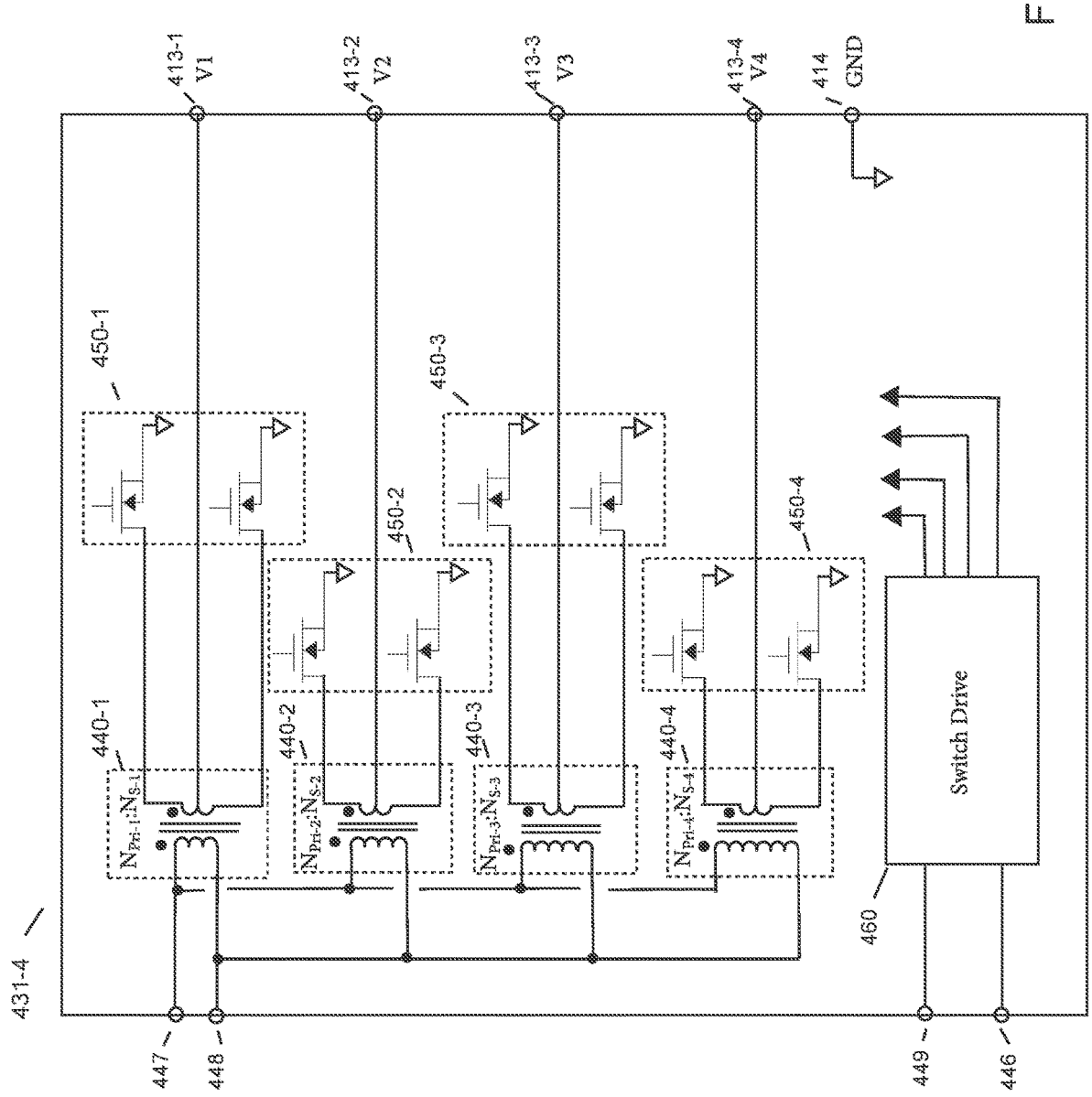
FIG. 22 shows a schematic of a multi-rail output POL circuit.

Referring to the schematic diagram of FIG. 22, a first embodiment of the multi-rail output POL circuit 431-4 is shown having a plurality of independent transformers, 440-1, 440-2, 440-3, and 440-4, each preferably having a two-turn center-tapped secondary winding connected to a respective rectifier circuit, 450-1, 450-2, 450-3, 450-4, for supplying power to its respective output terminal, 413-1, 413-2, 413-3, 413-4 at a respective output voltage V1, V2, V3, V4. Each transformer may include a multi-turn primary winding connected to the AC input terminals 447, 448, the number of turns being chosen to establish a respective desired turns ration, $N_{Pri-1}$: $N_{S-1}$, $N_{Pri-2}$: $N_{S-2}$, $N_{Pri-3}$: $N_{S-3}$, $N_{Pri-4}$: $N_{S-4}$. For example, the primary windings of transformers 440-1, 440-2, 440-3, and 440-4 may have 36, 40, 44, and 48 turns producing turns ratios of 36:1, 40:1, 44:1, and 48:1 and voltage transformation ratios of 1/36, 1/40, 1/44, and 1/48 respectively. With a nominal driving voltage of 48 Volts, the POL circuit would produce nominal output voltages: V1=1.3 V, V2=1.2 V, V3=1.1 V and V4=1.0 V. As the driver circuit 490B changes the AC power bus voltage, the output voltages of the POL circuit will change according to their respective voltage transformation ratios with each rail tracking the others up or downward. In this way all voltages being supplied to the semiconductor die may be adjusted upward or downward together. As explained in more detail below, power management circuitry on the semiconductor die may change the voltage of individual loads efficiently by selecting the appropriate voltage rail or change all of the voltages in unison by sending voltage commands to the driver circuit which will accordingly adjust the drive voltage.

Other turns ratios may be chosen to provide different rail voltages, e.g. turns ratios of 24:1, 32:1, 40:1, and 48:1 may be used to provide rail voltages V1=2V, V2=1.5V, V3=1.2V, and V4=1V, or turns ratios of 48:1, 56:1, 64:1, and 72:1 may be used to provide rail voltages V1=1.0V, V2=0.86V, V3=0.75V, and V4=0.66V respectively, from a 48 Volt drive. Although the above examples of turn ratios use uniform increments of 8 turns between adjacent rails, it will be appreciated that other, either uniform or non-uniform, increments of turns may be used between some or all of the rails to set the desired rail voltage spacing according to the design requirements. Similarly, lower turns ratios may be used to accommodate lower output voltages from the first power conversion stage.

As shown in FIG. 22, each rectifier circuit, 450-1, 450-2, 450-3, 450-4, comprises two controlled rectifier switches which are controlled by switch drive circuit 460. The rectifier circuits can convert AC signals received from the respective secondary windings to unipolar voltages. As shown, the controlled rectifier switches may preferably comprise MOSFET devices connected in common source configuration to simplify the gate drive circuitry which may be ground referenced. Because the primary windings of all four transformers, 440-1, 440-2, 440-3, and 440-4 are driven by the same AC signal, their secondary waveforms will be synchronized allowing the respective secondary switches to be driven in unison by the same signal further simplifying the drive circuitry. The switch drive circuit 460 may be integrated into the POL circuit 431-4 as shown having inputs for receiving a control signal from the driver circuit 490B and a bias voltage. Alternatively, the drive circuit may be integrated into the driver circuit 490B as described above which may provide gate drive signals directly to the switches 450-1, 450-2, 450-3, 450-4 as described above in connection with FIG. 6. Common terminal 414 provides the ground or common connection for each of the multiple outputs.

Figure 24:
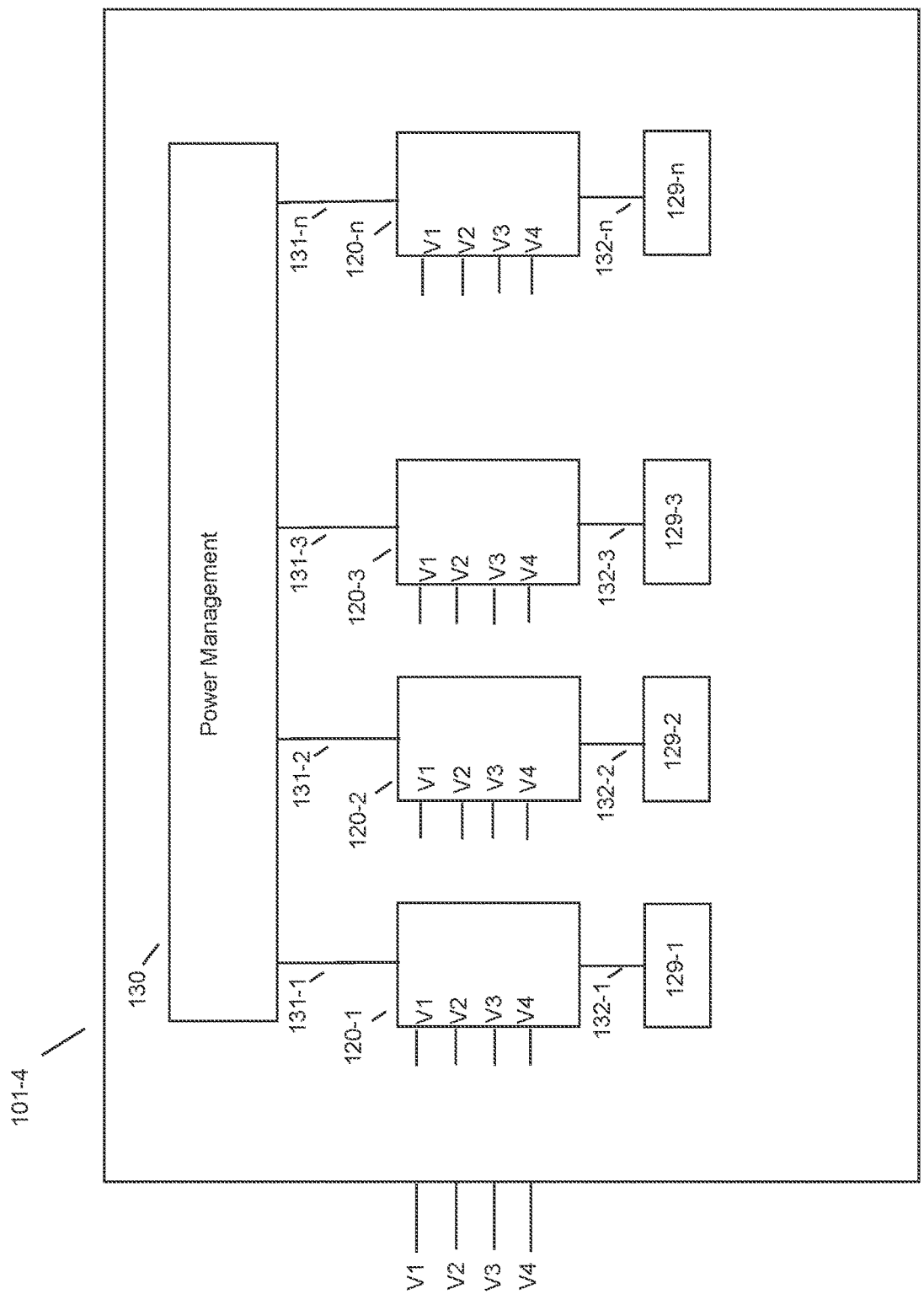
FIG. 24 shows a generalized block diagram of multiple loads on an ASIC with power management control and individual rail selection and regulation circuitry.

Referring to FIG. 24, a block diagram of the power system of semiconductor die 101-4 is shown including a power management control circuit 130, and a plurality of rail selection and regulation circuits 120-1, 120-2, 120-3, and 120-n, each supplying power to a respective load 129-1, 129-2, 129-3, and 129-n on the semiconductor die. The power management control circuit 130 may provide one or more signals to rail selection and regulation circuits, 120-1, 120-2, 120-3, 120-n, to set the desired voltage for its respective load, 129-1, 129-2, 129-3, and 129-n. The die 101-4 may include internal voltage supply rails, V1, V2, V3, V4, as shown in FIG. 24, connected to receive power from the respective outputs of the POL circuit 431-4 (FIG. 21B).

Figure 25:
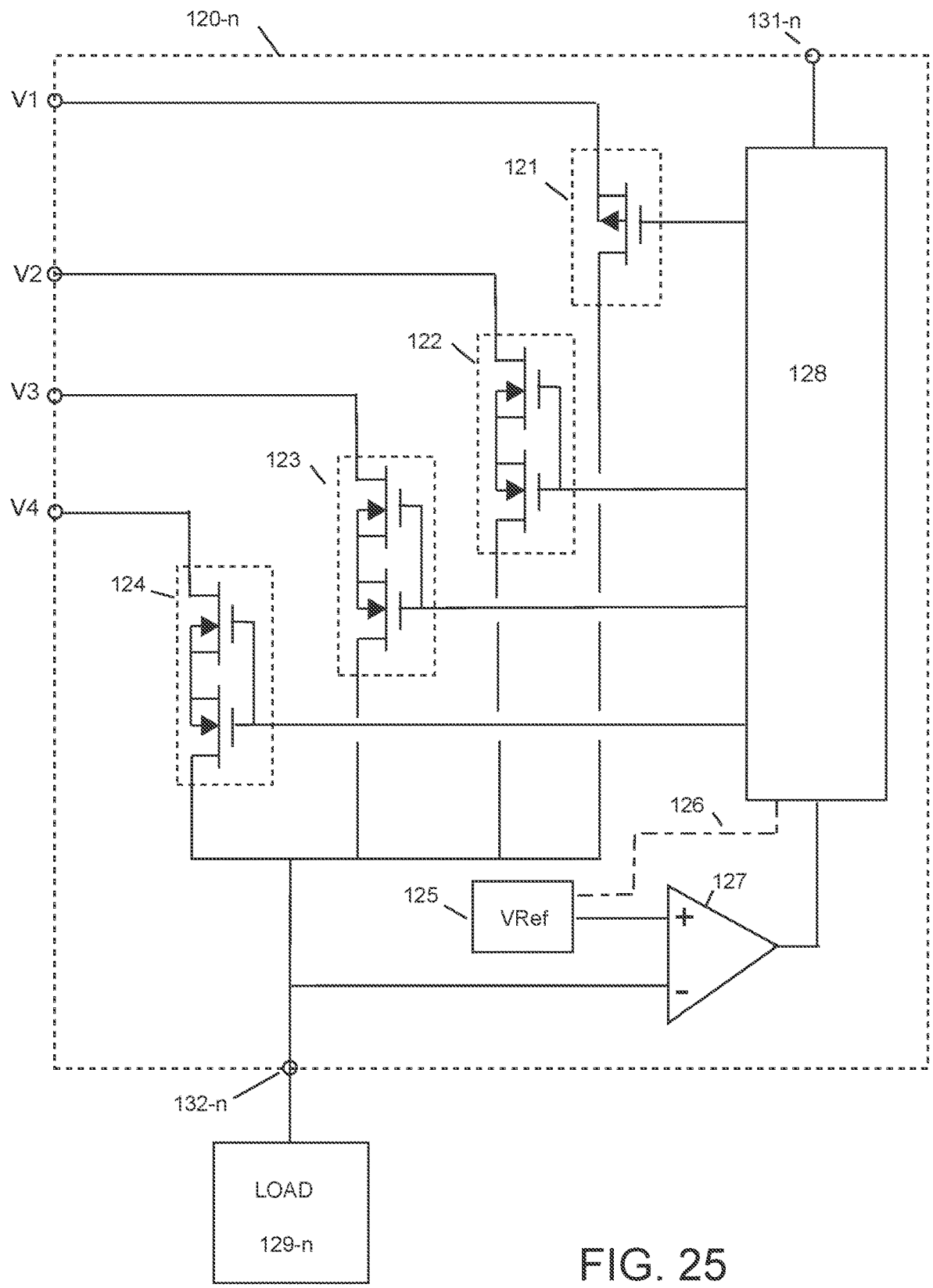
FIG. 25 shows an example of rail selection and regulation circuitry for a single load.

The circuitry of a representative one of the rail selection and regulation circuits, 120-n, is shown in greater detail in FIG. 25 having an input 131-n for receiving voltage commands from the power management circuit 130, a control circuit 128, a comparator 127, a voltage reference 125, switches 121, 122, 123, and 124, inputs connected to the voltage rails, and output 132-n connected to supply power to load 129-n. In operation, the control circuit 128 may enable one of the switches 121, 122, 123, or 124, at a time to select the appropriate input voltage (rail voltage V1, V2, V3 or V4) from which power is drawn to supply power to load 129-n. Preferably the lowest rail voltage that provides sufficient headroom for the rail selection and regulation circuit 120-n to regulate the voltage supplied to load 129-n is chosen to minimize power dissipation in the regulator. Consistent with the description of FIG. 22 above, it assumed that V1>V2>V3>V4. As shown in FIG. 25, switches 122, 123, and 124 may comprise dual MOSFETs connected back-to-back in a common source configuration to block current in both directions when OFF to isolate its respective rail from the higher voltage rails. Since rail voltage V1 is greater than the three other rail voltages V2, V3, and V4, the control circuit 128 may easily drive switches 122, 123, and 124 with sufficient voltage to turn on both of the MOSFETs in the respective switches. Switch 121 may comprise a single MOSFET device since current need only be blocked in one direction when OFF. Although shown as dual MOSFETs connected back-to-back in a common source configuration, switches 122, 123, and 124 may be implemented using any appropriate technology to block current flow in either direction.

The switches 121, 122, 123 and 124 may serve dual functions of (1) rail selection (isolating the load from the unselected voltage rails when OFF and connecting to the appropriate rail when ON) and (2) regulation (acting as a series pass device in a linear regulator when ON). In such a system, the control circuit 128 may connect the gate(s) of the selected switch 121, 122, 123, 124 to the output of error amplifier 127 which may provide a feedback signal by comparing the load voltage with the reference voltage, VRef, produced by reference 125. The voltage reference 125 may adjust the reference voltage according to the commands received via an optional control bus 126 either directly from the power management circuit 130 or as shown through control circuit 128. For example, a single reference may be used with a voltage divider, which may be adjusted by commands received from the power management circuit 130 or control circuit 128, to scale the reference voltage output to the error amplifier as needed for regulation of the selected load voltage. Alternatively, individual reference voltages may be provided.

In operation, the control circuit 128 may select the appropriate rail, V1, V2, V3, V4, by enabling the respective switch, 121, 122, 123, 124, and scaling the reference voltage according to the voltage command received from the power management circuit 130. The error amplifier provides the drive signal for the selected switch, modulating the conductivity of the switch to adjust the voltage drop across the switch, thereby regulating the load voltage according to the commands received from the power management circuit 130.

It will be appreciated that with the primary windings connected as shown in FIG. 22, the outputs of the POL circuit 431-4 each will track changes in the drive voltage allowing all outputs to be adjusted in unison. Thus the power management circuit 130 may adjust the supply voltages for the entire semiconductor die 101-4 by issuing commands to the driver 490B, e.g. over the communication bus 497. For example, in a typical ASIC or processor, a great multiplicity of independent loads may each require adjustment of the supply voltage according to their respective operational status and the overall power dissipation on the die. The linked-output POL circuit advantageously may use a single driver, with a single AC bus, to drive all of the primary windings in the POL circuit as shown. However, the outputs of the POL circuit 431-4 may be controlled independently by using separate drivers for each transformer primary winding, e.g. as described above in the multi-driver multi-rail system (Section E).

Figure 23:
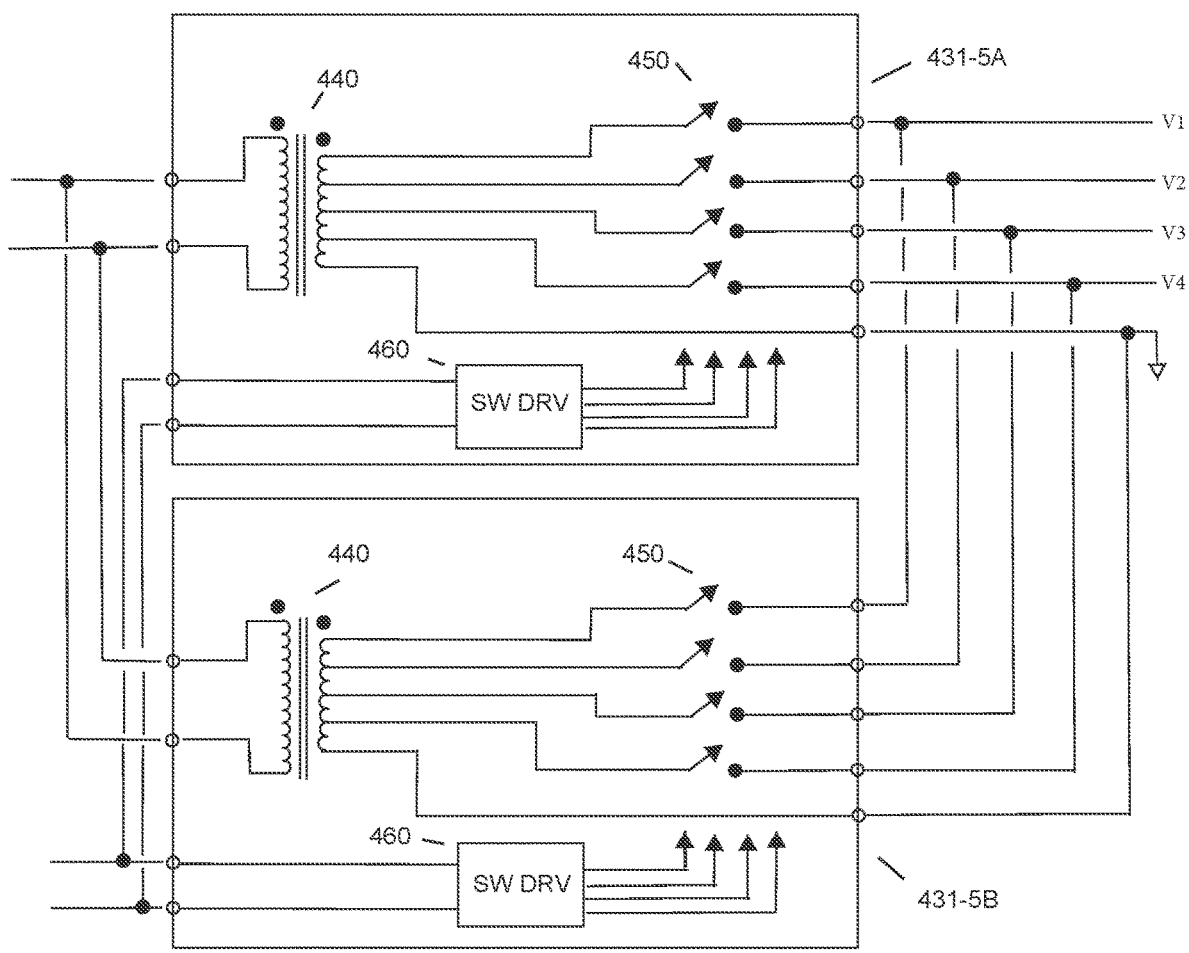
FIG. 23 shows a schematic of an alternate embodiment of a multi-rail output POL circuit.

Referring to FIG. 23, an alternate embodiment is shown comprising two multi-rail POL circuits 431-5A, 431-5B. As shown, the POL circuits 431-5A, 431-5B are identical, each having a transformer 440 a switch driver 460, and secondary switches 450. The transformer is shown having a single primary winding and a multi-tap secondary winding. Each tap of the secondary is connected to a half-wave rectifier, which may preferably be a MOSFET switch. The two POL circuits are connected in parallel at the input and output except that the primary windings are connected in phase opposition. As a result, each of the two secondary windings and their respective switches 450 form half of a center-tapped full-wave rectified four rail output circuit. It will be appreciated that the POL circuit 431-5 as shown may be combined in pairs to provide a scalable architecture able to address increasing power requirements.

In an alternative embodiment of the rail selection and regulation circuits, the switches 121, 122, 123, 124 (FIG. 25) may be used exclusively to connect and disconnect the regulation circuitry to the appropriate rail voltage and a dedicated down-stream regulator, preferably a series-pass regulator, may be used to regulate the selected rail voltage.

H. Ground Referenced Driver

Figure 26A:
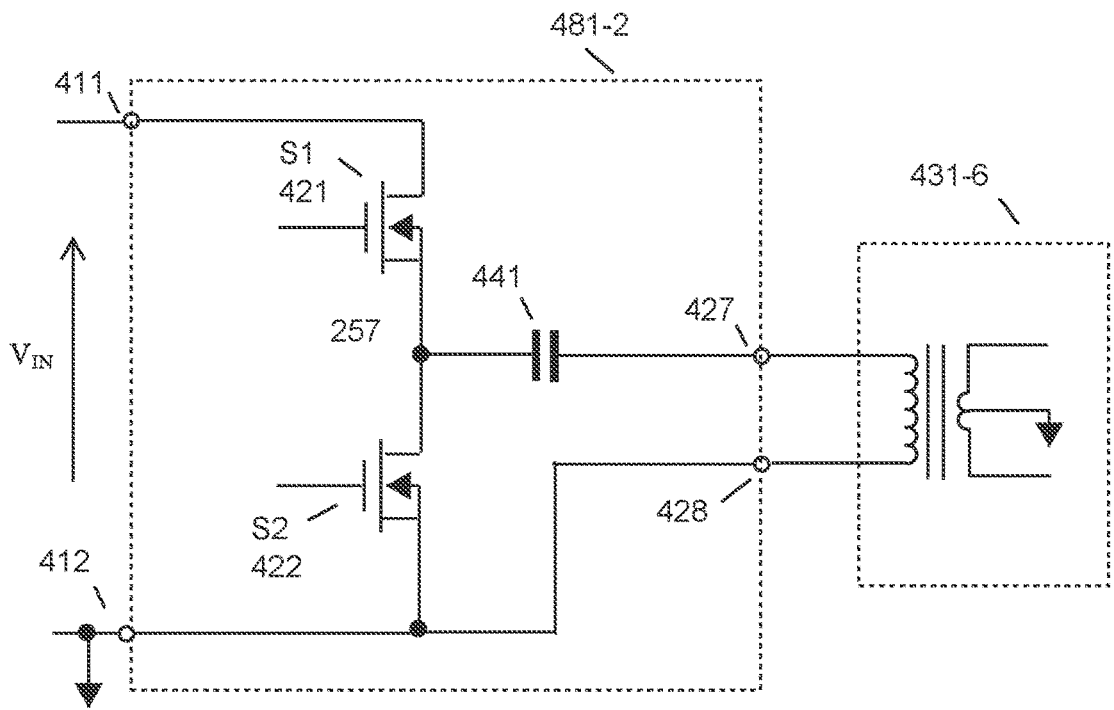
FIGS. 26A and 26B show modified driver circuitry.

Referring to FIG. 26A, ground-referenced driver circuit 481-2 is shown. Instead of the full-bridge configuration as shown in FIGS. 5, 6, and 9, driver circuit 481-2 uses a half-bridge configuration comprising switches S1 421 and S2 422 to drive output terminal 427 through capacitor 441, which may be a resonant capacitor, e.g. for implementing a Sine Amplitude Converter as described in the SAC Patent. As a result of the half bridge configuration, the primary windings of the POL circuits 431-6 are driven with a peak-to-peak voltage that is half of the input voltage, $V_{IN}$, feeding the driver circuit. Because one end of the primary windings is tied to ground potential through output terminal, 428, and the other end is capacitively coupled through capacitor 441 to the half-bridge driver, the voltage at terminal 427 will have an average of essentially zero volts and positive and negative excursions that are approximately $+\frac{1}{2} V_{IN}$ and $-\frac{1}{2} V_{IN}$. For a $V_{IN}$=50 VDC, the AC drive signal will have maximum excursions of 25V or less from ground maintaining a safe low voltage (SELV) drive signal. Furthermore, because the average voltage at either terminal will be zero (the transformer primary winding may be said to be driven by an average voltage of essentially zero volts), electro-migration concerns along the power bus and in the semiconductor package, e.g. the substrate, are eliminated.

In FIG. 26A, the input voltage, $V_{IN}$, is received at a source terminal 411 and a common terminal 412. Depending on which of the switches S1 421 and S2 422 is turned on, a node 257, referred to as the "switching node," is connected to either the source terminal 411 or the common terminal 412, and drives the output terminal 427 through the capacitor 441.

Figure 26B:
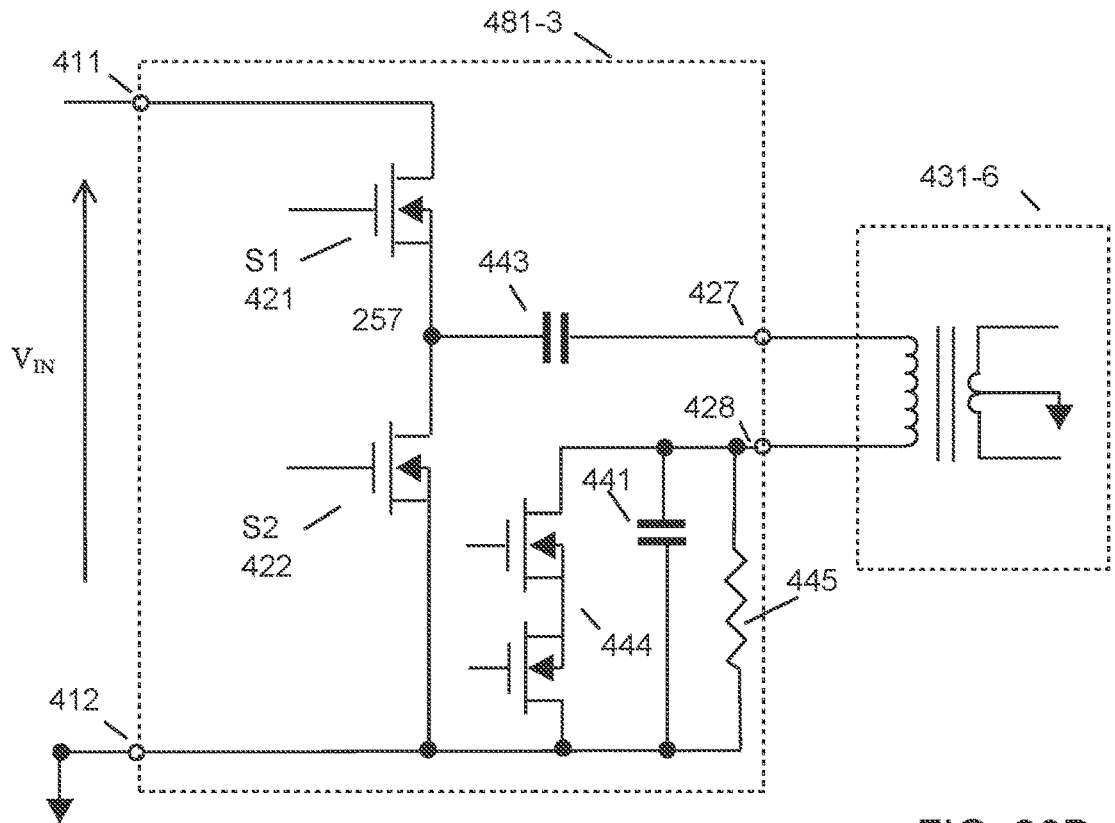

Referring to FIG. 26B, a second ground-referenced driver circuit 481-3, which maintains the low voltage benefits of driver 481-2 (FIG. 26A), is shown including a resonant capacitor 441, a DC blocking capacitor 443, and a clamp switch 444 connected in parallel with the resonant capacitor 441 for implementing the clamped resonant capacitor control described in the CSAC Patent. The clamp switch 444 may consist of two MOSFETs connected to block current in both directions as shown, preferably with the gates connected together. The DC blocking capacitor is assumed to be at least an order of magnitude larger than the resonant capacitor such that resonant period of the transformer and DC blocking capacitor combination is large compared with the duration of the longest clamp phase (switch 444 ON time) that may be implemented in the converter. Preferably, the resonant capacitor 441 may be sized relative to the primary-reflected leakage inductance of the transformer to keep the voltage across the resonant capacitor 441 to within a small percentage, e.g. to about 10 percent or less, of the driver input voltage, $V_{IN}$, to keep the size of the clamp switch small. For example, in a driver adapted for operation with an input voltage of 50V, the resonant capacitor may be chosen to produce a maximum excursion of 5V or less from ground. Limiting the voltage excursions across the resonant capacitor also has the beneficial effect of reducing the peak-to-peak voltage difference between terminals 427 and 428 while maximizing the peak-to-peak voltage impressed across the primary winding(s) of the POL circuits 431-6. An optional high value resistor 445, e.g. 1 mega Ohm, may be connected in parallel with the resonant capacitor 441 to keep the voltage at terminals 427 and 428 definite in the event that the clamp switch 444 is not used. Like the drive voltage at terminal 427, the voltage at terminal 428 will have an average voltage of essentially zero volts albeit with a much smaller, e.g. 10% or less, maximum excursion from ground potential. Thus the driver circuit shown in FIG. 26B has the advantage of providing ground referenced control terminals for operation of the clamp switch while also providing a safe low voltage drive signal and an average drive voltage of essentially zero volts on each of the drive terminals.

In some examples, the driver circuit 481-2 and/or 481-3 provides a driver voltage having a maximum peak-to-peak voltage, Vpeak, that is at least a multiple, X1, times greater than at least one of the rail voltages (e.g., V1, V2, V3, V4 of FIGS. 23 and 24) and X1 is at least six. In some examples, X1 is at least 10. In some examples, X1 is at least 20. In some examples, the driver circuit 481-2 and/or 481-3 provides power to the semiconductor package 100-1 at a bus voltage, Vbus, that is at least a multiple, X2, times greater than at least one of the rail voltages (e.g., V1, V2, V3, V4 of FIGS. 23 and 24) and X2 is at least 15. For example, the terminal 428 can be referenced to a voltage potential (e.g., voltage potential across the resonant capacitor 441) within a predetermined range of the voltage at the common terminal 412, in which the predetermined range is not more than 10% of the source voltage $V_{IN}$.

The switch control circuitry, e.g. switch control 425 (FIGS. 5, 6, 9) and optional communication 483 and regulation circuitry 482 circuitry (FIG. 9) are not shown in FIGS. 26A and 26B for clarity. However, it should be understood these features may be used in combination with the ground-referenced driver circuits in FIGS. 26A and 26B.

II. Semiconductor Package with Top-Mounted Integrated POL Circuits

Figure 1:
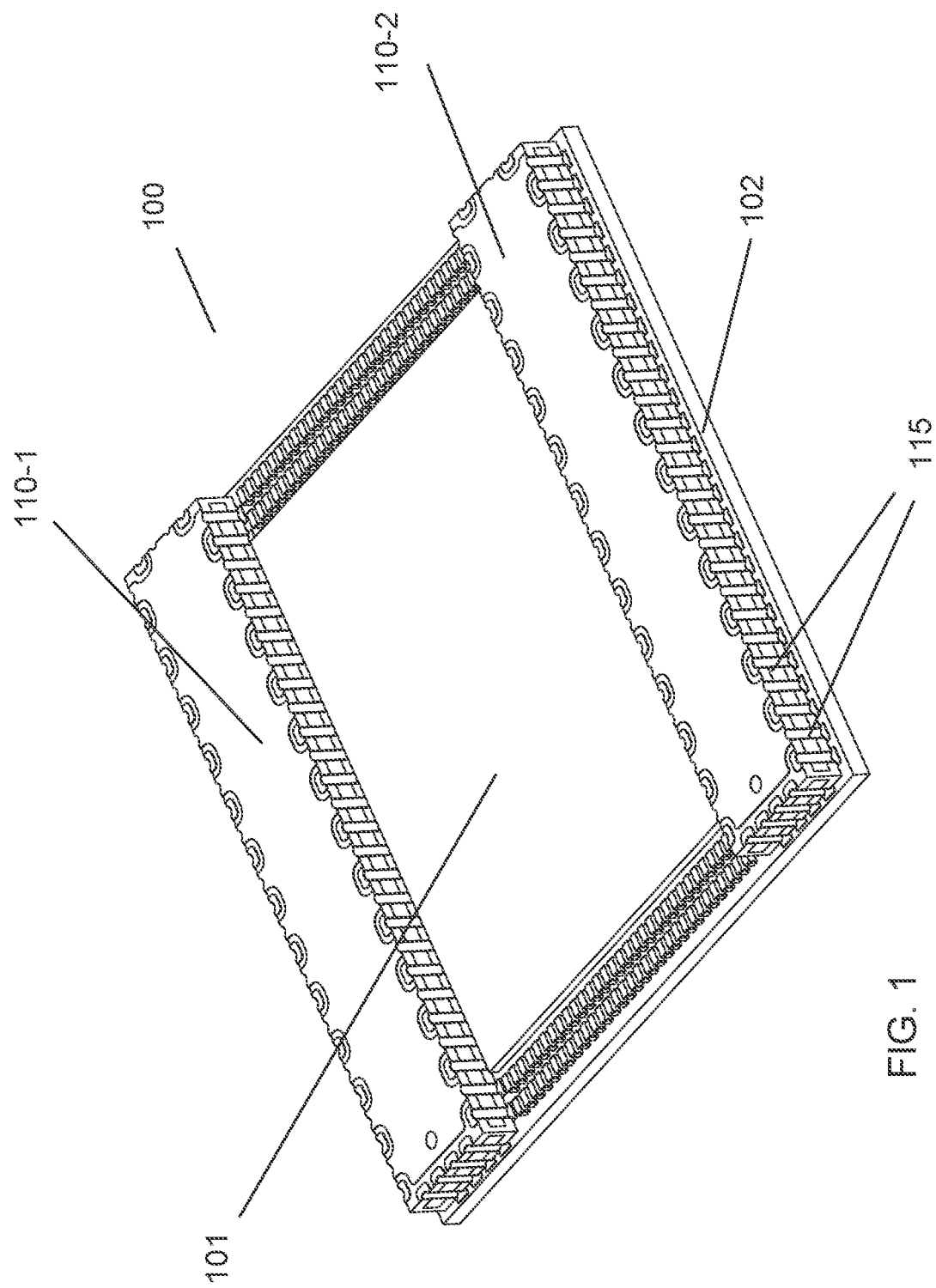
FIG. 1 shows an isometric view of a semiconductor package with integrated power-converter output circuitry.
Figure 2:
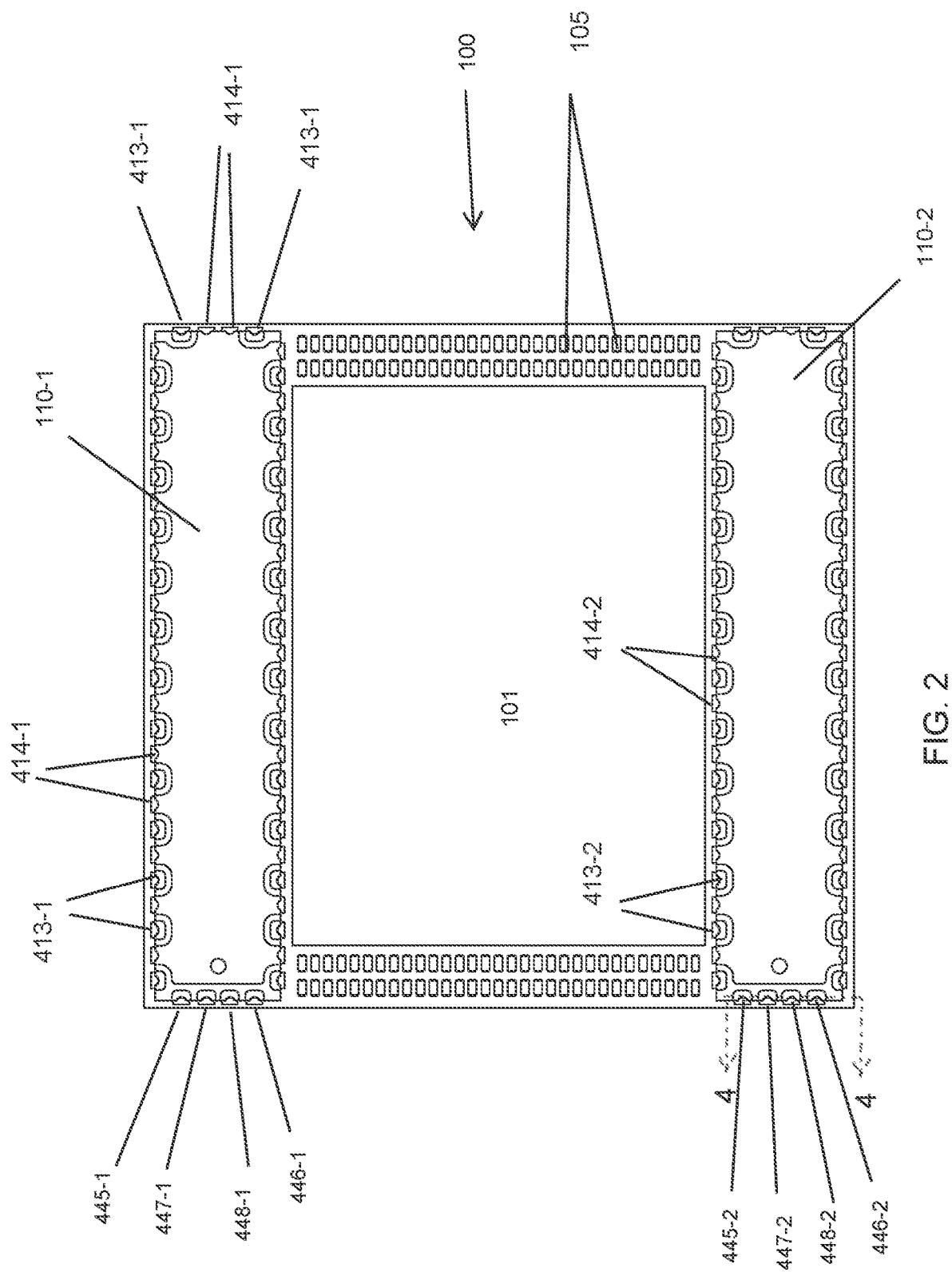
FIG. 2 shows a top plan view of the semiconductor package.
Figure 3:
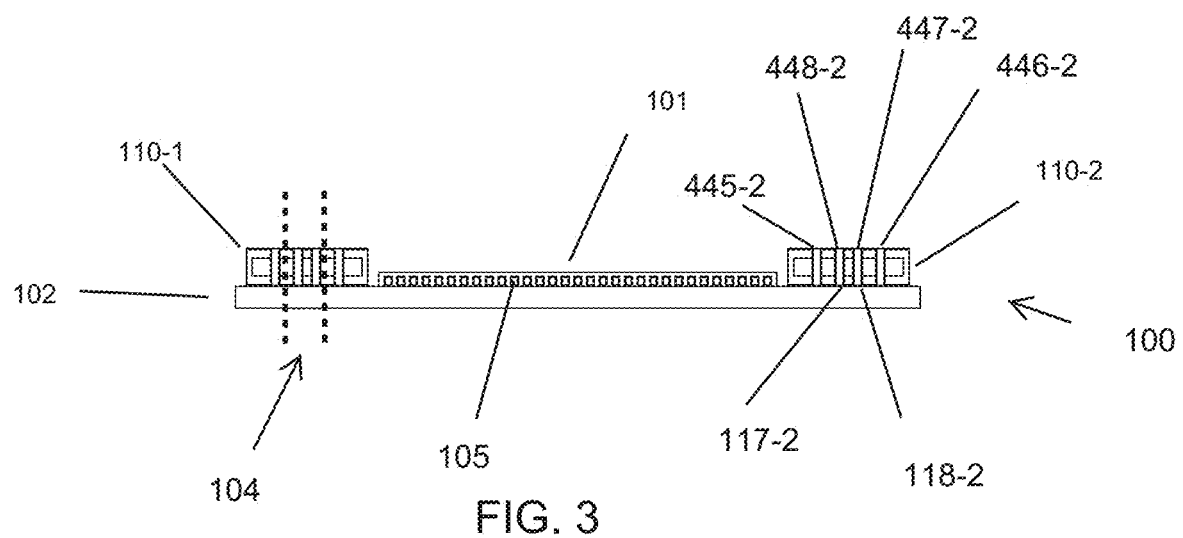
FIG. 3 shows a side view of the semiconductor package.

In FIGS. 1, 2 and 3, a semiconductor package 100 is shown (in isometric, top plan, and side views, respectively) including a multilayer substrate 102, a large semiconductor die 101, such as an ASIC, CPU, or GPU, and a plurality of POL modules 110-1, 110-2 mounted to the substrate adjacent to the semiconductor die 101. As shown in FIG. 8, the POL modules 110 may be packaged as a leadless module, such as described in Vinciarelli, et al., *Panel Molded Electronic Assemblies with Multi-Surface Conductive Contacts*, application Ser. No. 14/731,287, filed Jun. 4, 2015, and incorporated here by reference (the "Panel Mold" application"), having connections 115 (FIGS. 1, 8) for surface mount soldering to respective conductive pads on the substrate 102 and preferably include shielding for improved low noise performance. (See, e.g. leadless electronic module 100 described in connection with FIGS. 1-3 of the Panel Mold application.) The POL modules 110-1 and 110-2 (FIGS. 1-3) may each include a respective POL circuit, e.g. 431-1, 431-2, as described in connection with FIG. 7.

Referring to FIG. 1, the POL modules 110-1, 110-2 are shown having a multiplicity of electrical contacts 115 arranged along their respective perimeters. The contacts may be formed as shown in FIGS. 1-3 and 8 (and as described in the Panel Mold application) to extend along the entire vertical span of the perimeter walls and onto the top and bottom module surfaces. The common terminals may be extended as shown onto the top and bottom surfaces to form shielding. As shown for the two POL Module example in FIGS. 1-3, a plurality of discrete components 105, such as capacitors, e.g. for filtering, may be provided in the free space along the semiconductor die 101. It may be preferable for very high current applications to use four POL modules, each mounted along a respective one of the four sides of the semiconductor die 101 to lower the interconnection resistance between the POL module outputs and the die. Using four POL modules to power the die may allow a reduction in the length of each POL module, e.g. by a factor of two, leaving space for discrete components such as capacitors along a respective one of the four sides of the semiconductor die 101.

In FIG. 2, several of the contacts 115 are labeled to show their preferred function. For example, at the left end of each POL module as shown in FIG. 2, two terminals are labeled consistent with FIG. 7 showing the AC power inputs 447-1 and 448-1 for module 110-1 and 447-2 and 448-2 for module 110-2; similarly, two terminals are labeled showing the respective bias and control inputs: 449-1 and 446-1 for POL module 110-1 and 449-2 and 446-2 for POL module 110-2. A multiplicity of output terminals 413-1, 413-2 and ground terminals 414-1, 414-2 are provided along the perimeter of the POL modules 110-1, 110-2 respectively to provide a low impedance distributed connection to the substrate.

In FIG. 7, the substrate 102 of semiconductor package 101 is represented with broken lines: electrical connections between the substrate 102 and a system board (to which it may be connected) are represented by interface connections 465, 466, 467-1, 468-1, 467-2, and 468-2; connections contained within the broken lines may be formed by the substrate 102; and connections outside the broken lines may be formed by the system board which typically may be a multi-layer printed circuit board ("PCB"). The driver circuit 481 may be mounted away from the point-of-load, e.g. the semiconductor die 101 or the semiconductor package 100, on the system level board, which may provide electrical connections between the driver and the semiconductor package 100 or substrate 102 as shown symbolically in FIG. 7. Note that connections to the semiconductor die 101, which may be great in number, are not shown in FIG. 7 for clarity.

The substrate 102, in typical applications, carries a multitude of electrical connections between the semiconductor die 101 and a system-level PCB using, e.g. connector pins, ball grid array, land grid array, or other connection schemes. The breakdown voltage of the substrate 102 may be very low, e.g. on the order of 3 to 5 volts; the number of interface connections available for power connections between the substrate 102 and the system PCB may be limited due to the large number of input/output signals ("I/Os") required by the semiconductor die 101; and consequently the ability to efficiently conduct large power supply currents may be limited. In FIG. 7, the POL circuit bias power connections 449-1 and 449-2 and control connections 446-1 and 446-2 are shown connected to bias and control interface connections 465, 466 respectively. The POL circuit power connections 447-1, 447-2, 448-1, and 448-2 are shown connected to power interface connections 467-1, 467-2, 468-1, 468-2.

As shown, the bias and control signals (FIG. 7), which are relatively low in voltage and power, may be handled by the substrate 102 and interface connections 465, 466 in the same manner as normal I/O signals to, and within, the package, e.g. the bias and control signals may be routed laterally along the substrate as shown by the small signal bus 415 within the substrate 102 (FIG. 7). However, connections to the AC power bus 410, which may need to carry voltages exceeding the voltage capabilities of the substrate 102, may not be suitable for wiring on the substrate. Accordingly, FIG. 7 shows a separate set of interface connections (467, 468) for carrying AC power from the bus 410 to each of the POL circuits (431-1, 431-2): interface connections 467-1 and 468-1 for POL circuit 431-1; and interface connections 467-2 and 468-2 for POL circuit 431-2. The AC power interface connections 467 and 468 will be described in greater detail with reference to the semiconductor package drawings of FIGS. 1-4.

A. High Voltage Connections

Figure 4:
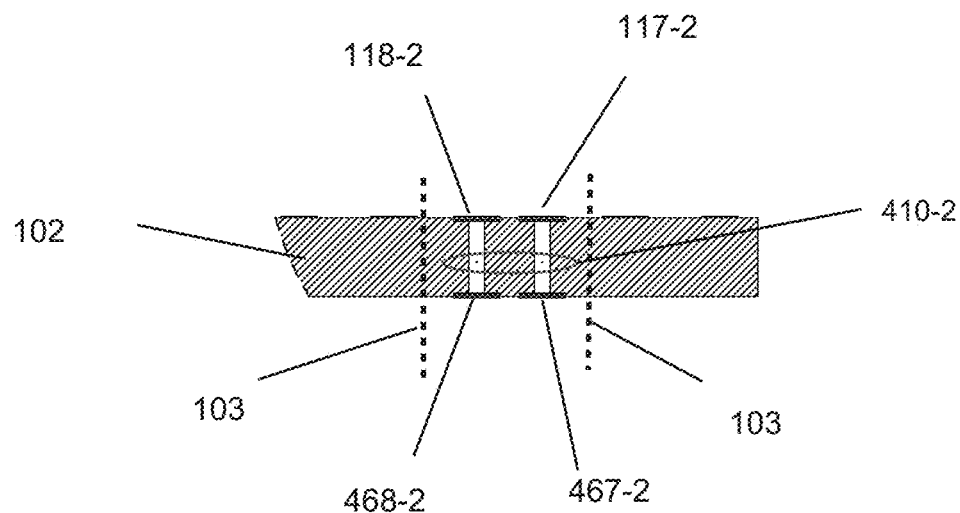
FIG. 4 shows a cross-sectional view of a portion of the substrate of the semiconductor package revealing power input connections for the output circuitry.

The section taken along lines 4-4 (FIG. 2) is shown enlarged in the cross-sectional view of FIG. 4 providing physical detail of the AC power bus 410-2 (FIGS. 4, 7) in the substrate 102. Because its voltage may exceed the voltage rating of the substrate, the AC power bus, e.g. 410-2, may be kept as short as possible in the substrate preferably extending vertically through the thickness of the substrate 102 from the interface connections 467-2, 468-2 on the bottom of the substrate to the conductive pads 117-2, 118-2 on top of the substrate for mating with POL module terminals 447-2, 448-2, respectively. The interface connections (e.g., 467-2, 468-2) on the bottom of the substrate 102 may be electrically coupled to connectors on the system board using, e.g. connector pins, ball grid array, land grid array, or other connection schemes. All lateral travel of the AC power bus in the substrate is preferably eliminated or, if unavoidable, then minimalized. In the example shown in FIGS. 1-4, the AC power bus is divided into two sections 410-1 and 410-2 each of which consists of a pair of plated vertical through holes in the substrate 102 around which a minimum keep-out distance is maintained to account for the low interlayer breakdown voltage of the substrate. Thus as shown in FIG. 4, AC power bus 410-2 includes two vertical conductive through holes (collectively 410-2) connected to interface contacts 467-2, 468-2 on the bottom of the substrate 102 and conductive pads 117-2, 118-2 on the top of the substrate 102, all of which are preferably vertically aligned minimizing or eliminating any lateral conduction requirements for the AC power bus. The heavy broken lines 103 in FIG. 4 indicate a volume 104 of the substrate 102 defined by a projection around the high voltage connection in which no other electrical features should be formed to manage the relatively high voltage requirements of the AC power bus and the low breakdown voltage of the substrate. Ground referenced through holes may be formed in the substrate around the keep-out area to provide shielding.

B. Magnetic Field Management

Figure 12:
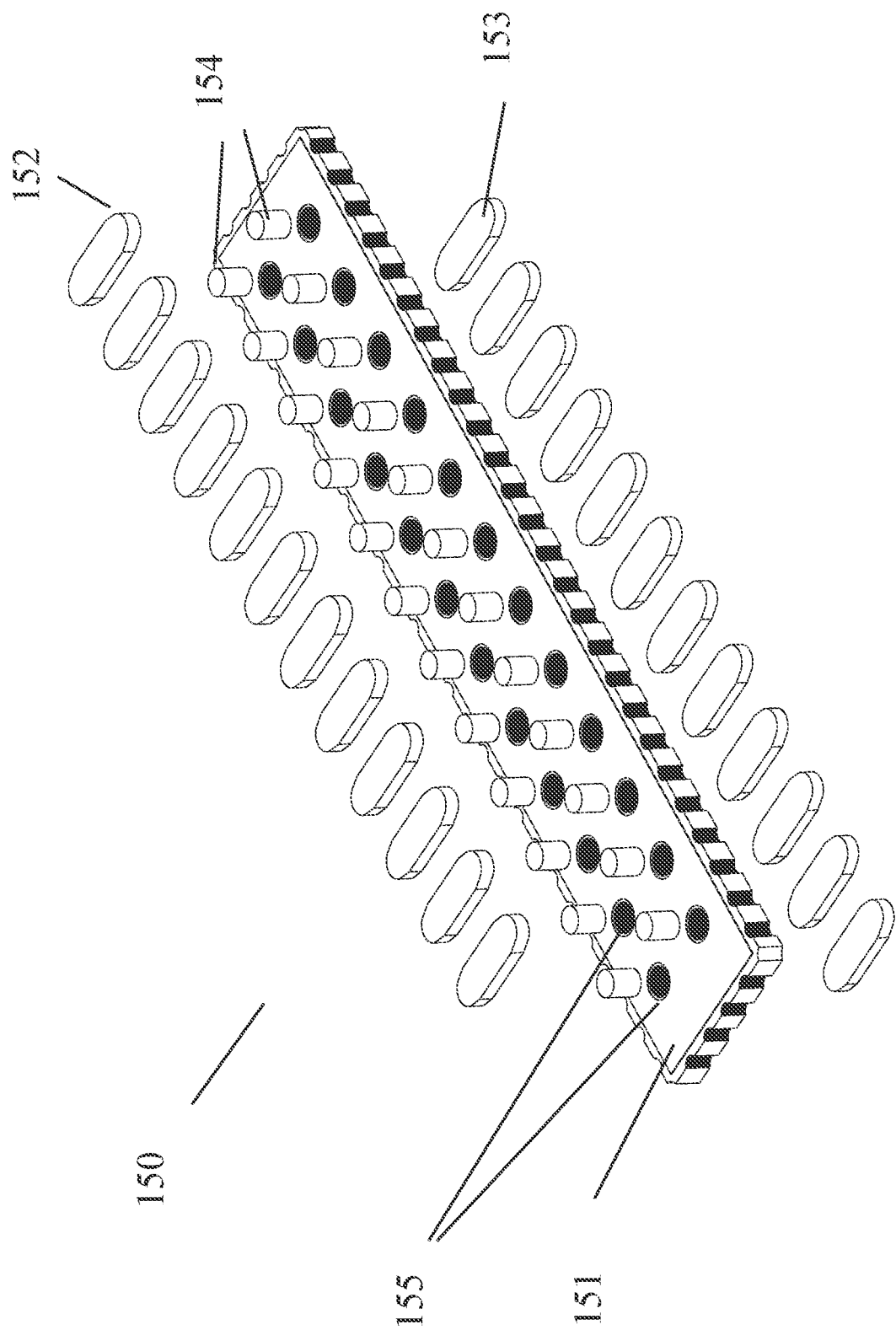
FIG. 12 shows an exploded view of a transformer structure for use in an output circuit.

Referring to FIG. 12, an example of a magnetically permeable core structure 150 in the POL modules 110-1, 110-2 is shown including a multilayer printed circuit board 151 in which the transformer windings (not shown) may be formed around a plurality of holes 155. The transformer may incorporate self-aligned windings as described in Vinciarelli, *Self-Aligned Planar Magnetic Structure and Method*, U.S. patent application Ser. No. 14/822,561, filed Aug. 10, 2015, (the "Self-Aligned" patent application) assigned to VLT, Inc. of Sunnyvale, Calif., the entire disclosure of which is incorporated herein by reference). Core legs 154 may be placed in the holes 155 and mated with top and bottom core plates 152 and 153 when assembled to form complete magnetic loops. A small gap of 1 mil or less may be provided between one or both of the top and bottom core plates and the legs. Preferably, the effective magnetic permeability (θ of the core legs and core plates is greater than 25 and preferably greater than 100, and more preferably greater than 200 to contain the magnetic flux during operation. Lower effective permeability core structures may result in greater flux leakage which can couple to signal conductors in the substrate, semiconductor die, or system board creating noise problems.

Figure 14A:
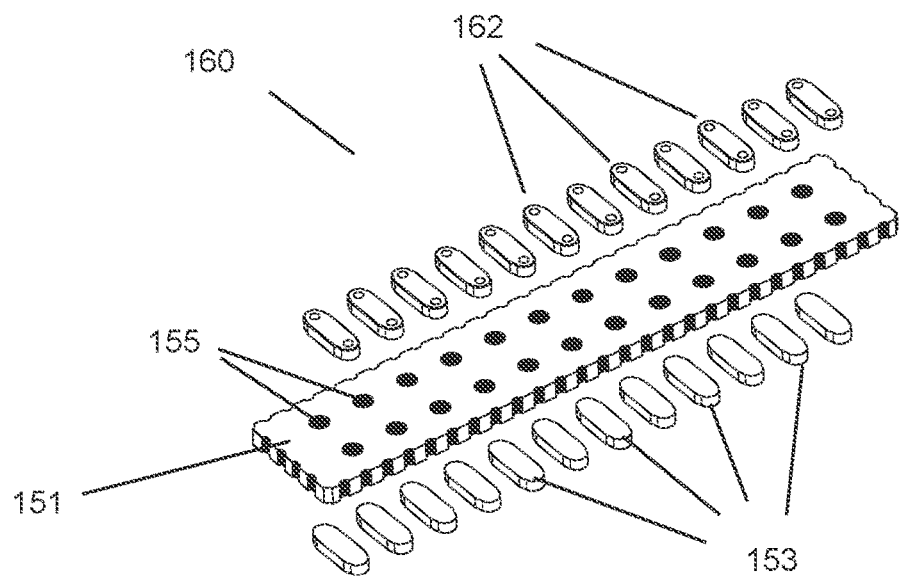
FIG. 14A and FIG. 14B show exploded and assembled views of an alternate transformer structure for use in an output circuit.
Figure 14B:
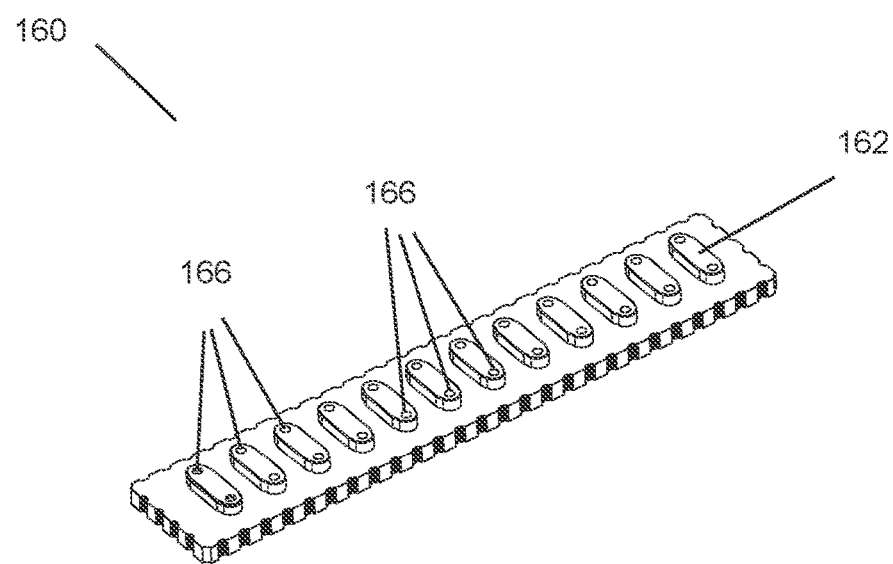

Referring to FIGS. 14A and 14B, an alternate transformer structure 160 is shown having essentially the same PCB 151 in which the transformer windings (not shown), preferably self-aligned windings described in the Self-Aligned patent application, may be formed around a plurality of holes 155 to accommodate core legs such as the core legs 154 shown in FIG. 12, and bottom core plates 153 on the bottom surface of the PCB 151. The top core plates 162 may as shown include apertures 166 arranged to align with apertures 155 in the PCB when the core is in position. The transformer 160 may be fabricated by affixing the bottom core plates 153 to the bottom surface of the PCB 151 with a suitable adhesive such as epoxy. The top core plates 162 may be similarly affixed to the top surface of the PCB 151 with apertures 166 aligned with apertures 155. A magnetically permeable fluid, such as a powder with or without a suitable binder material or other injectable material, preferably having a permeability of 10 or greater, may be injected through apertures 166 to fill the PCB apertures 155 and alternatively some or all of the core apertures 166. After the apertures are filled with the magnetically permeable material, the core apertures may be sealed with an epoxy or other suitable material to prevent the magnetically permeable material from escaping. One or more plugs can be disposed in one or more of the apertures 166, in which the one or more plugs form seals covering the respective one or more of the apertures 166. Optionally, the PCB may be heated before the apertures are filled and sealed to ensure that the apertures are completely filled after the PCB is cooled. For example, the core plate 153 can be a ferrite core plate, and the core plate 162 can be a ferrite core plate having one or more apertures that is/are filled with one or more plugs.

The transformer structure 160 of FIGS. 14A and 14B may be particularly well suited to low voltage and high frequency applications such as the POL circuits discussed above. Using a material that may be injected as a powder or fluid into the apertures in the PCB overcomes the mechanical tolerances of conventional planar magnetic core structures where small solid core legs have to fit within small PCB apertures. By replacing small solid magnetic core legs with magnetic powder or fluid, PCB apertures can be filled with a permeable medium providing greater PCB aperture utilization and converter efficiency.

Additionally, as mentioned above, the output circuit may be covered with a conductive covering, preferably connected to a common terminal, to provide additional shielding.

C. Noise Management

The POL modules 110-1, 110-2, and preferably the driver circuits also, may use zero-current switching and/or zero-voltage switching to minimize the slew rate of voltages and currents in and around the semiconductor package 100 and system board. The power converter topologies shown in FIGS. 6, 7, and 9 may preferably be based on the Sine Amplitude Converter ("SAC") topology described in the SAC patent or on the clamped capacitor resonant topology described in the CSAC patent application. The SAC topology is preferred for the sinusoidal current and voltage waveforms and zero-current switching ("ZCS") and zero-voltage switching ("ZVS") and the ability to constrain the slew rates of voltages and currents in the converter. For example, the slew rates may be limited to $dV/dT \leq Vpk/(Top*0.2)$ and $dI/dT \leq Ipk/(Top*0.2)$ in the output circuits shown in FIGS. 6 and 7 using the SAC topology. In contrast, multiphase buck regulators typically exhibit characteristic current slew rates an order of magnitude greater than those in the output circuits.

In one example, the POL modules 110-1, 110-2 in the semiconductor package 100 may use a current multiplication factor K of 48 and an input voltage of 48 volts to supply 1 VDC at 100 A to the semiconductor die. Using a SAC topology operating at 1 MHz (Top=1 µS), the maximum voltage is 48V and the maximum current Iin=100/48=2.1 Amps. Thus, the voltage and current slew rates for the output circuit may be limited to 240 V/µS and 10.4 A/µS.

D. Thermal Management

Figure 10:
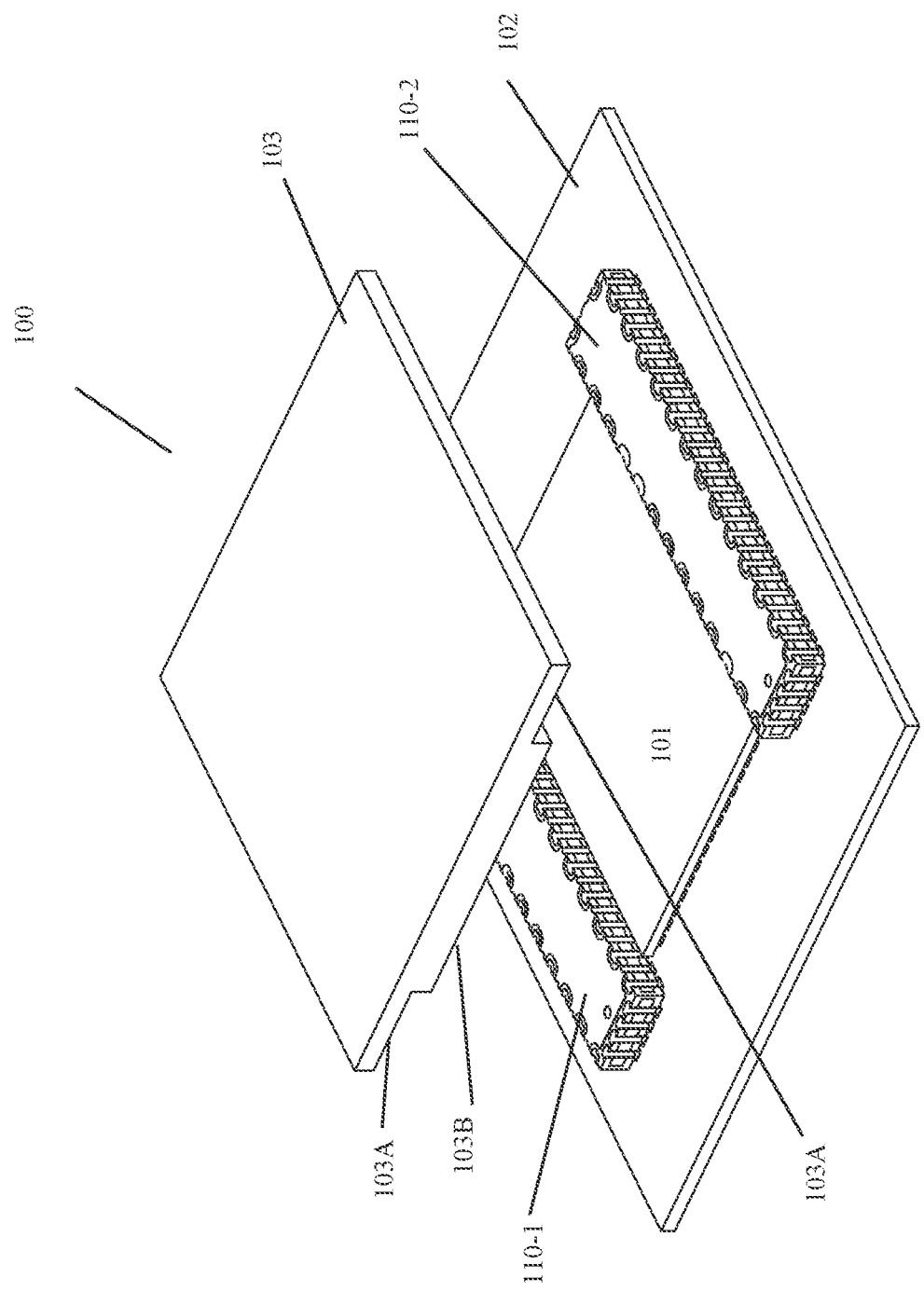
FIG. 10 shows an isometric view of the semiconductor package with the lid exploded from the assembly.

The semiconductor package 100 may include a lid 103, preferably made of thermally conductive material such as aluminum, copper, or other metallic or non-metallic thermally conductive material as shown in FIG. 10. The lid as shown may have a stepped lower surface to mate or accommodate the difference in height between the relatively short semiconductor die 101 and the relatively tall POL modules 110-1, 110-2. Lower surfaces 103A of lid 103 may mate with the top surfaces of the POL modules 110-1, 110-2 and lower surface 103B may mate with the top surface of the semiconductor die 101. Referring to the side view of the semiconductor package 100 in FIG. 11, dotted arrows 104, 105 and 106 show the direction of heat flow in the package. Heat generated by the semiconductor die 101 typically flows up through the lid as shown by arrow 106. Other proposed in-package power solutions rely on removal of the heat generated in the regulator circuits through the substrate, thus heating the substrate and the semiconductor die. However, the POL modules 110-1, 110-2, as shown provide thermally conductive conduits between the substrate and the lid, facilitating removal of heat generated by the output circuits directly through the lid and further provide a path for heat flow from the die 101 through the substrate 102 and up through the POL modules 110-1, 110-2 as shown by arrows 105 and 104. As a result, the package 100 provides thermally enhanced operation over other solutions.

III. Semiconductor Package with Bottom-Mounted Integrated POL Module

Referring to FIGS. 15A, 15B, 16A, 16B, 17, and 20, a second semiconductor package 300 is shown in bottom and top isometric exploded, top and bottom isometric assembled, and side views, respectively. Like the package 100 described above (FIGS. 1-3, 10, 11), the second semiconductor package 300 includes a multilayer substrate 302 and a large semiconductor die 301, such as an ASIC, CPU, or GPU, mounted on a top surface 302A of the substrate 302 and also includes a POL module 310. However, as shown in FIGS. 15A, 15B, 16A, 16B, and 17, the POL module 310 may be mounted on the bottom surface 302B of the substrate 302 beneath the die 301 in semiconductor package 300. Although FIGS. 15A, 15B, 16A, 16B, and 17 show a single large POL module 310, a plurality of smaller POL modules may be used in place of the single large module shown.

Preferably, the POL module 310 (or POL modules) may occupy substantially all of the area beneath the semiconductor die 301 in the same, or a very similar, footprint allowing the remaining area, i.e. outside of the projection of the semiconductor die footprint, on the bottom surface, to be used for making connections between the substrate 302 and a system board. For example, the POL module 310 may preferably be smaller than, and fit completely within the footprint of, the die 301 as shown in the side view of FIG. 17. Note the difference 304 between the edge of the die 301 (on the top surface 302A of the substrate) and the edge of the POL module 310 on the bottom 302B of the substrate, which appears in FIG. 17 as symmetrical overhang on the left and right sides of the POL module. Although the POL module is shown slightly smaller than the die, it may be the same size as or slightly larger than the die, provided sufficient area remains for making connections between the die and the system board.

Figure 15B:
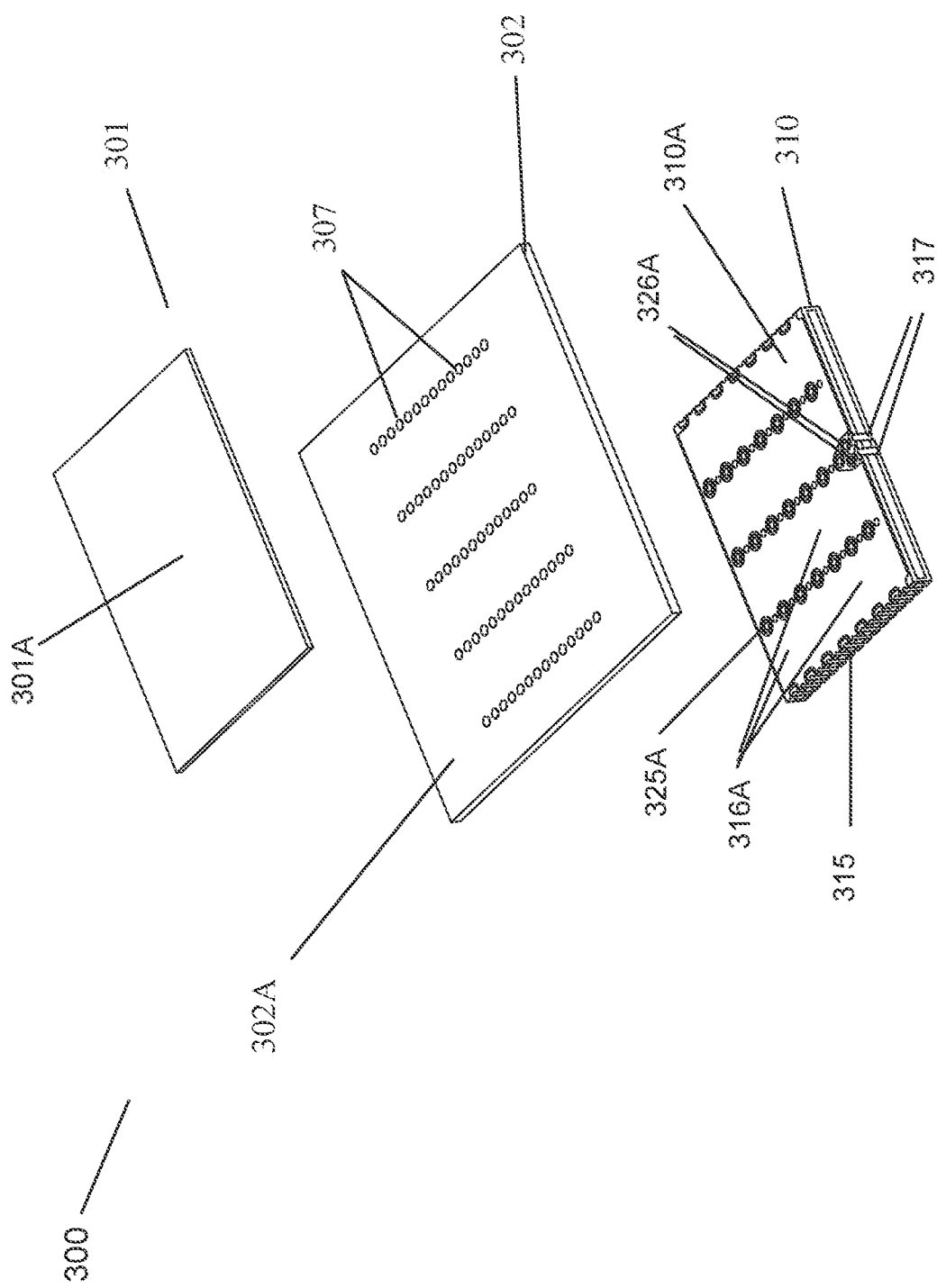
Figure 16A:
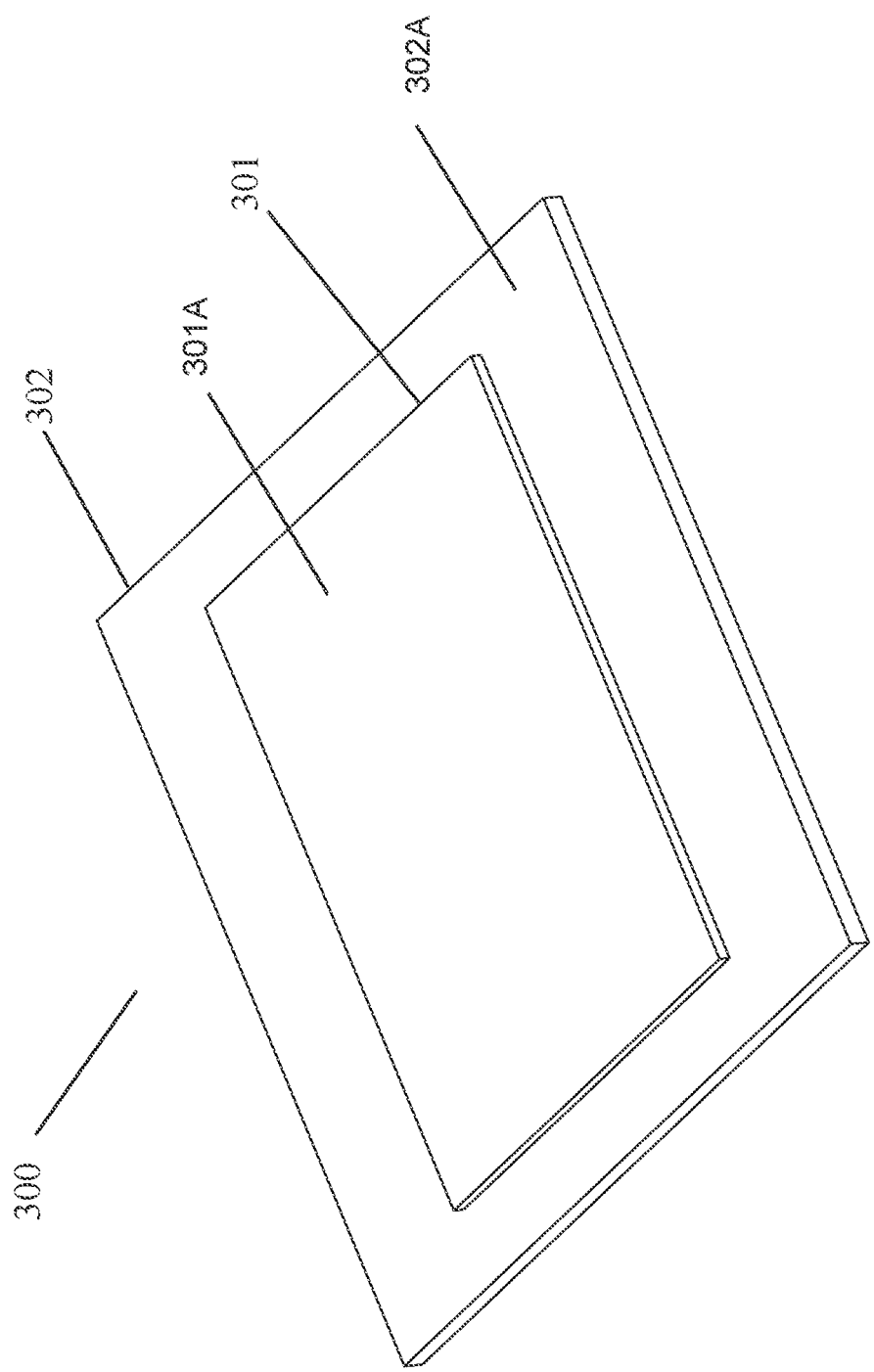
FIG. 16A and FIG. 16B show top and bottom isometric views of the second semiconductor package assembled.
Figure 16B:
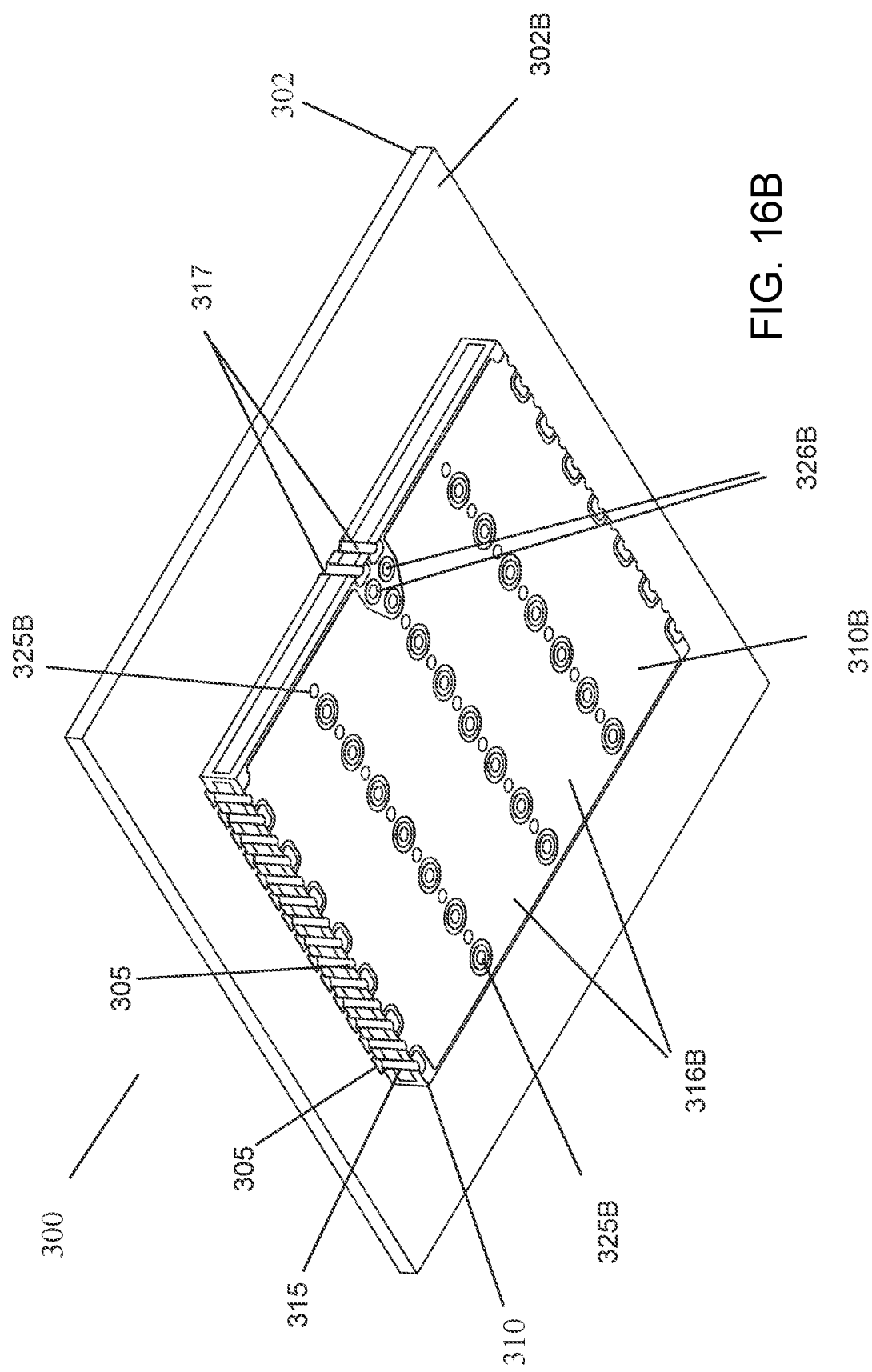
Figure 17:
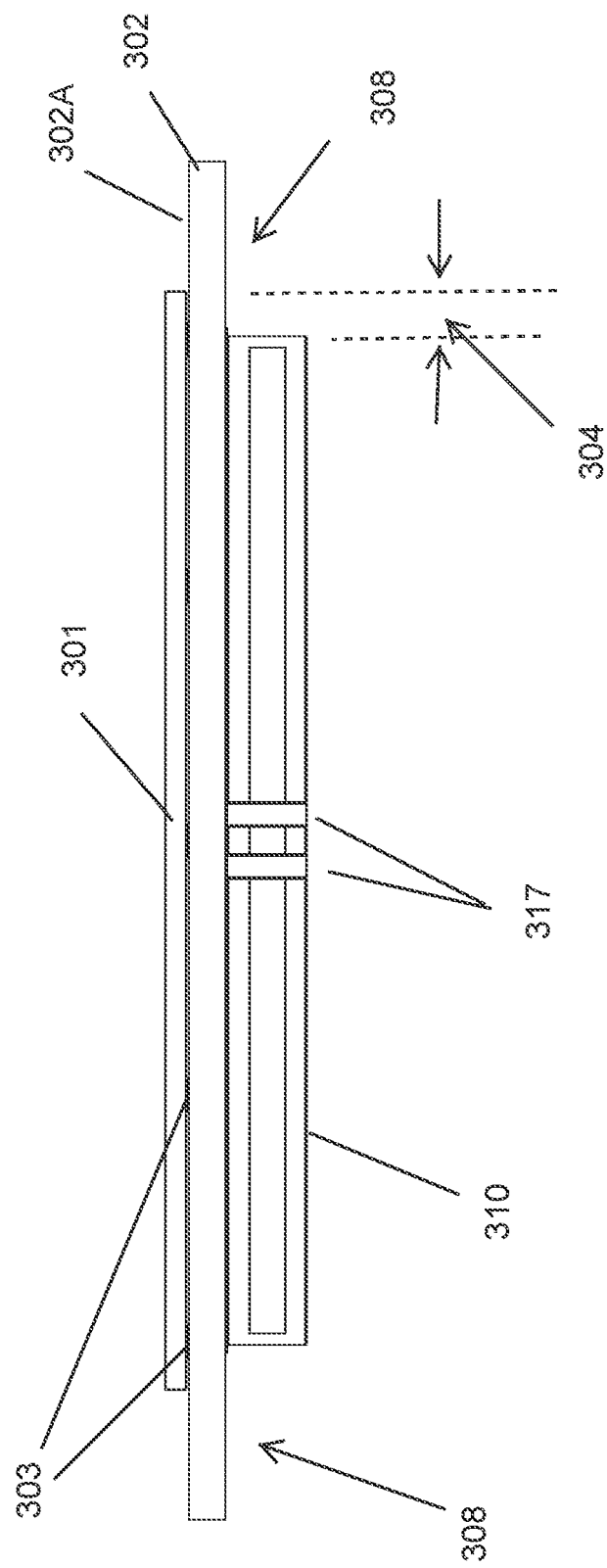
FIG. 17 is a side view of the second semiconductor package.

As shown in FIGS. 15-17, the POL module 310 may be preferably packaged as a leadless module, such as described in the Panel Mold application, having electrical connections for surface mount soldering to respective conductive pads on the substrate 302. For example, conductive terminations, e.g. terminations 315, may be provided along two or more sides of the POL module 310 for surface mount soldering to conductive pads 305 on the bottom 302B of the substrate 302. Additionally, conductive terminations, e.g. terminations 325A may be arranged along the top surface 310A of the POL module 310 for surface mount soldering to conductive pads 305 on the bottom 302B of the substrate 302. A pair of the conductive terminations, preferably located centrally and near an edge of the POL module 310 may be provided for making AC power connections, e.g. terminals 326A shown in FIG. 15B along a centerline and close to one edge of the POL module 310. Conductive terminations for the relatively low power bias and control signals may be provided along an edge of the module, e.g. terminals 317 are shown formed in an edge of the POL module 310 in FIG. 15B.

Preferably the conductive pads 305 on the bottom surface 302B may be electrically and thermally connected to conductive pads 307 on the top surface 302A of the substrate 302 (e.g. using conductive vias between the substrate layers (not shown)), which connect with power terminals 303 located on the bottom surface 301B of die 301. As shown in FIGS. 15A, 15B, and 17, direct vertical alignment may be established between power terminals 303, conductive pads 307, conductive pads 305, and conductive terminations 315 providing the shortest electrical and thermal path between the POL module 310 and the die 301. Additionally, the power terminals 303, conductive pads 307, conductive pads 305, and conductive terminations 315 may be spatially arranged to allow signal connections to be routed between them on the inner and optionally outer layers of the substrate 302. For example, the power connections including terminals 303, pads 307, vias (not shown), pads 305, and terminations 315 and 325A are shown spaced apart and generally arranged in columns, e.g. five columns are shown in FIGS. 15A, 15B. As shown in FIGS. 15B and 16B, the POL module 310 may include conductive coverings 316A, 316B extending over the top 310A and bottom 310B surfaces of the POL module 310, which as discussed above may enhance the thermal and noise performance of the POL module 310 and help contain the magnetic fields in the transformer cores.

Figure 11:
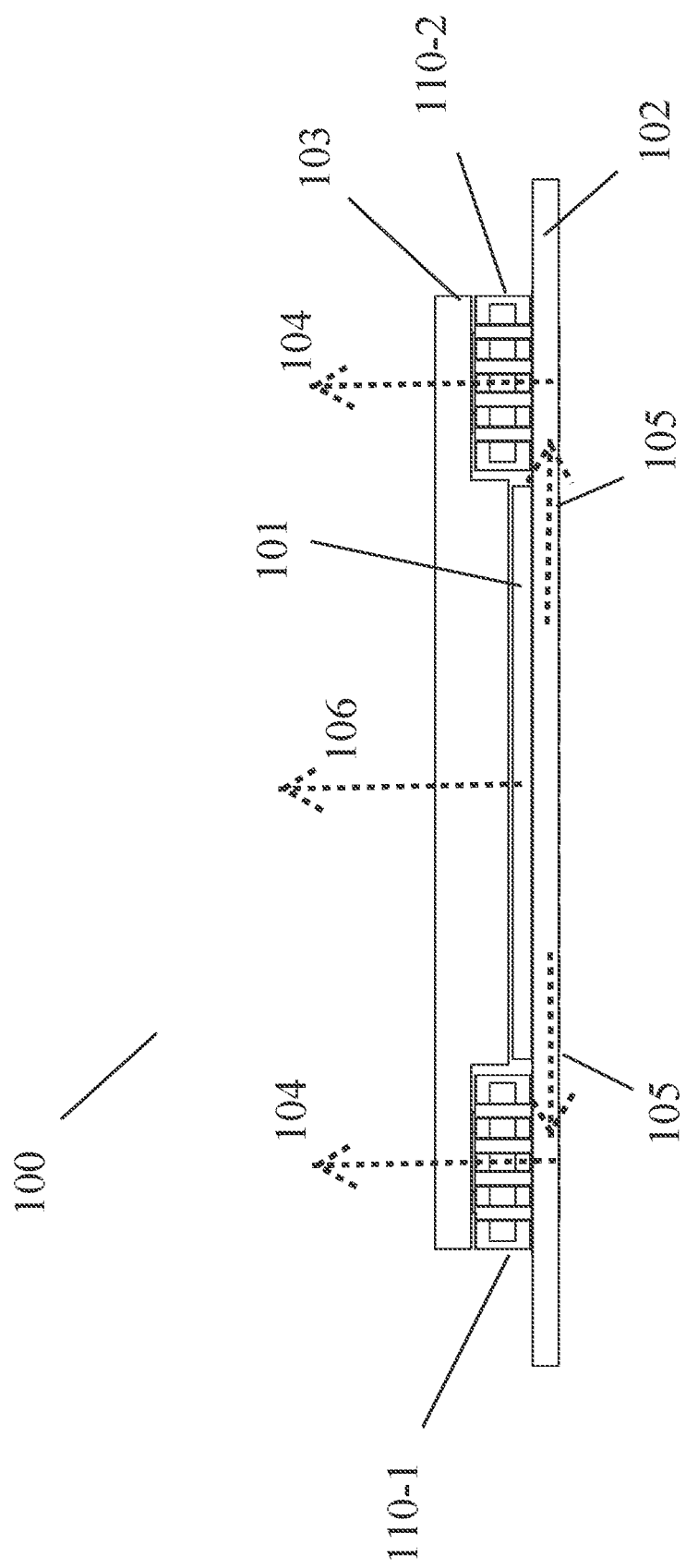
FIG. 11 shows heat flow in a side view of the semiconductor package with lid.

Referring to FIG. 16B, the POL module 310 may optionally include conductive terminals, 325B, 326B on the bottom surface 310B preferably aligned with the respective conductive terminations 325A, 326A on the top surface 310A of the POL module 310. Such through-module terminations, described in the Panel Mold application, may enhance the thermal conductivity, providing heat conductors through the POL module 310. As described in the Panel Mold application, a conduit (an example of which, conduit 265, is shown in FIG. 11 of the Panel Mold application) may expose conductive features to provide thermal and electrical connections between a substrate and the top and/or bottom conductive layers. The conductive terminations 325B, 326B may be used to engage with suitable terminations on the system board, directly or through a socket, to provide electrical connections and or allow heat to be conducted away through the system board as described below in connection with FIG. 20A.

Remote Gate Driver

Figure 19:
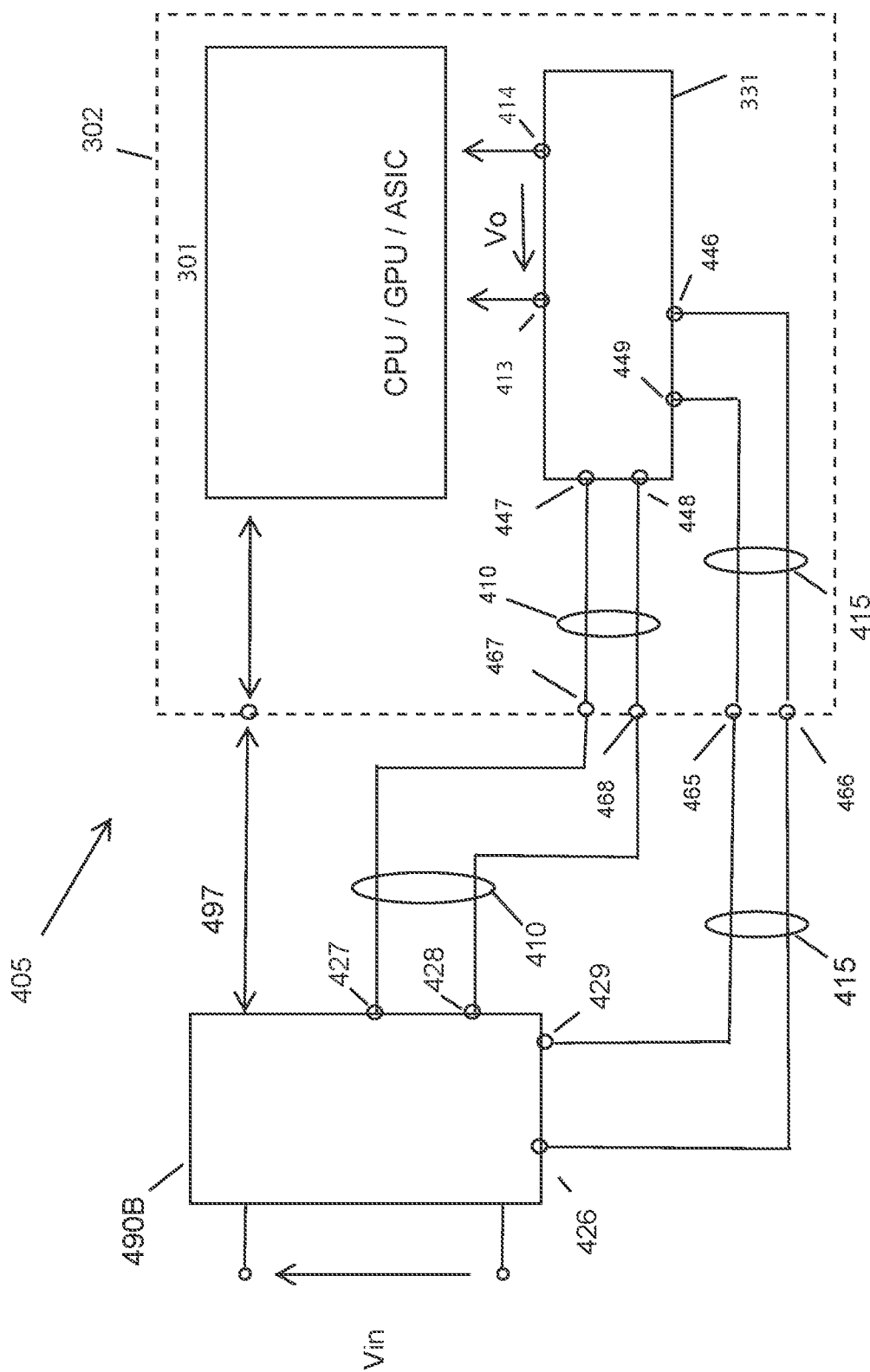
FIG. 19 is a schematic drawing of a system including a sixth modular power converter with an output chip integrated into a semiconductor package to supply power to a large semiconductor die.

Referring to FIG. 19, another power converter system is shown including a driver 490B, the semiconductor package 300 including the die 301 and a POL circuit 331 which may include the output transformer 440 and secondary switches 451-454 of the POL circuit 431 (FIG. 6). Preferably, the driver 490B may include transformer driver circuitry (481, FIG. 9) including switch control circuitry (e.g. 425, FIG. 9), power regulator circuitry (482, FIG. 9), and supervisory circuitry (483, FIG. 9) as described above and may be electrically connected to the semiconductor package 300 via connections formed by a system PCB (e.g. system board 11A or 11B in FIGS. 20A, 20B) on which the driver 490B and semiconductor package 300 may be mounted. Preferably, the switch driver (460: FIG. 6) which is shown as part of the POL circuits described above (431: FIG. 6) may be incorporated into the driver 490B (FIG. 19) to further reduce the size of the POL module 310.

Although counterintuitive because of the high switching frequency and the parasitic inductances introduced by the system board, the package of the driver 490B, the POL module package, and the semiconductor package 300, the switch driver may incorporate resonant gate driver techniques (See, e.g. Controller patent: Col. 13, ln 56 Col. 15, ln 24; FIGS. 8, 9) to use the inductances introduced by the connections between the separated driver 490B and the POL module 310 in semiconductor package 300 as some or all of the inductance required to resonantly charge and discharge the gate capacitances of the secondary switches in the rectification circuit of the POL module 310. Preferably additional inductance may be added in series with gate runs of the gate drive circuit using discrete, e.g. chip, inductors, to trim the circuit to the desired resonant frequency. For example, a power converter of the type shown in FIG. 19 configured to operate at 2 MHz with 250 nS half-cycles may require gate-voltage rise and fall times of 60-80 nS. Secondary switches configured to deliver 350 to 400 Amperes to the load may require 60 nC of gate charge to turn ON or OFF, representing approximately 12 nF of gate capacitance on each terminal 446, 449. The total inductance in the driver circuit between gate drivers in the driver 490B and the secondary switches in the POL module 310 therefore should be limited to 7.6 to 13.5 nH. Allowing for 1 nH of package inductance for each of the driver and POL module and discrete inductance of approximately 3 nH, the maximum distribution inductance budget for the gate runs is between 2.6 and 8.5 nH. Design rules may be provided to keep the gate runs within the allocated inductance budget, e.g. limiting the length and width of the conductive traces, requiring a ground plane in an adjacent layer separated by an acceptable dielectric thickness.

As described above, the controller may detect and adjust for small timing errors produced by differences in the parasitic inductances in the AC power bus 410 and in the gate drive signal bus 415. Preferably, more than 50%, or 75%, or most preferably more than 90% of the energy stored in the gate capacitances of the secondary switches in the POL module 310 may be recycled using at least in part the inductances introduced by the wiring between driver and POL module.

As shown in FIG. 19, the control outputs 426, 429 of driver 490B (e.g. either bias and control or gate driver outputs) may be connected to a signal bus 415 on the system board which may in turn be connected to terminals 465, 466 on the substrate 302 of the package 300 and carried through the substrate 302 to input terminals 449, 446, respectively. Similarly, a communication bus 497 as described above in connection with FIG. 9 may provide communication between the semiconductor package 300, e.g. with the die 301, and supervisory circuitry in the driver 490B.

The AC power connections 410 between the driver 490B (outputs 427, 428) and the POL module 310 (AC Inputs 447, 448) may be provided in part by the substrate 302 in the manner described above in connection with FIG. 4 using suitable conductor free zones around the AC connections formed in the substrate. Providing connections between the POL module 310 and the driver 490B through the substrate 302 may require routing the AC power laterally in or on the substrate in turn requiring elimination of any conductive features in a volume surrounding the AC power conductors, e.g. in a space radially around the conductors including a number of adjacent layers above and below the layer in which the AC power connections are made. Alternatively, the AC power connections 410 may be established between the system board (e.g. system board 11A, FIG. 20A) and the POL module 310 directly, e.g. using a socket 15 with suitable conductive terminations 16B to engage with terminations 326B on the bottom surface 310B of the POL module 310.

Figure 18:
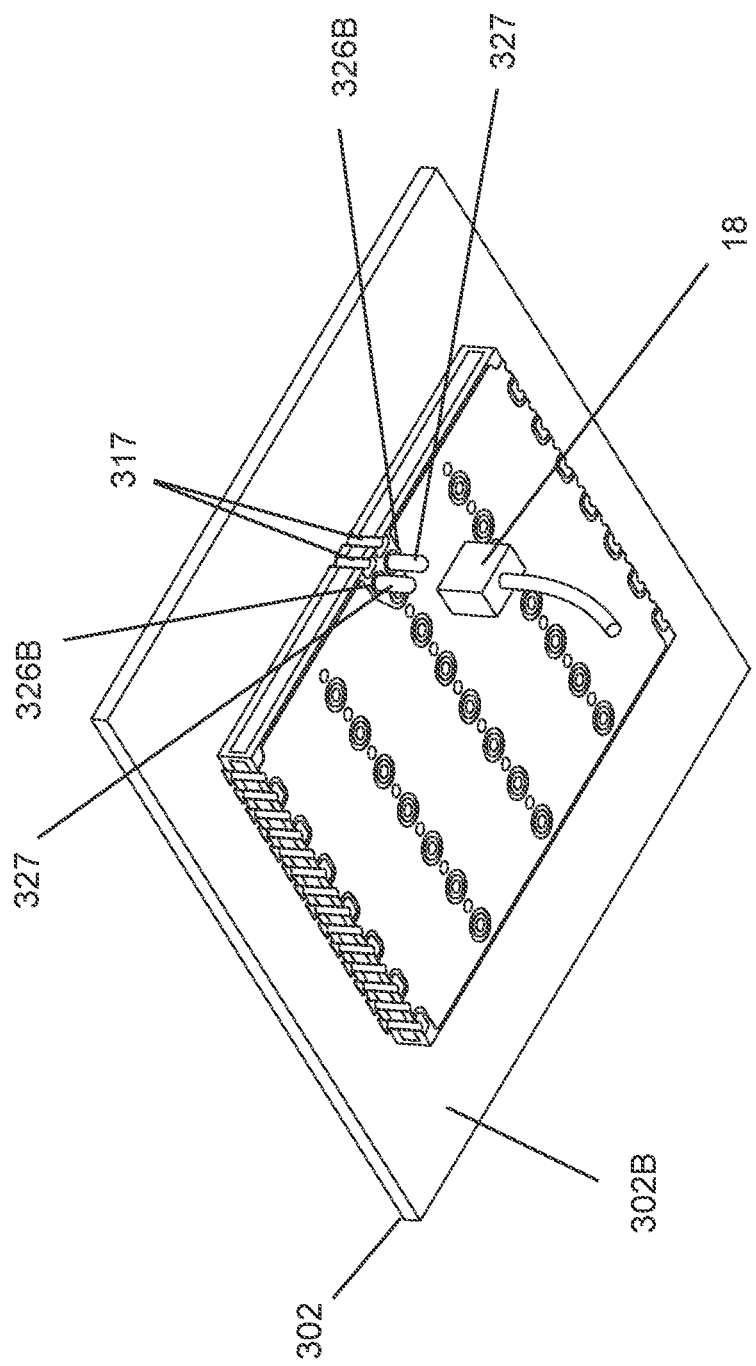
FIG. 18 is a bottom isometric view of a third semiconductor package.

Alternatively, the AC power connections 410 between the system board and the POL module 310 may be formed using a wire harness 18 including a connector body configured to engage with AC power pins 327 preferably protruding from the bottom surface 310B of the POL module as shown in FIG. 18. The AC power pins 327 may be configured to be inserted into, engage with, and soldered to conductive features, e.g. plated holes, formed in the POL module 310. For example, a conduit, such as the feature 265 shown in FIG. 11 of the Panel Mold application, may be appropriately shaped and sized to provide a conductive receptacle for a conductive pin.

Underside Thermal Management

Figure 20A:
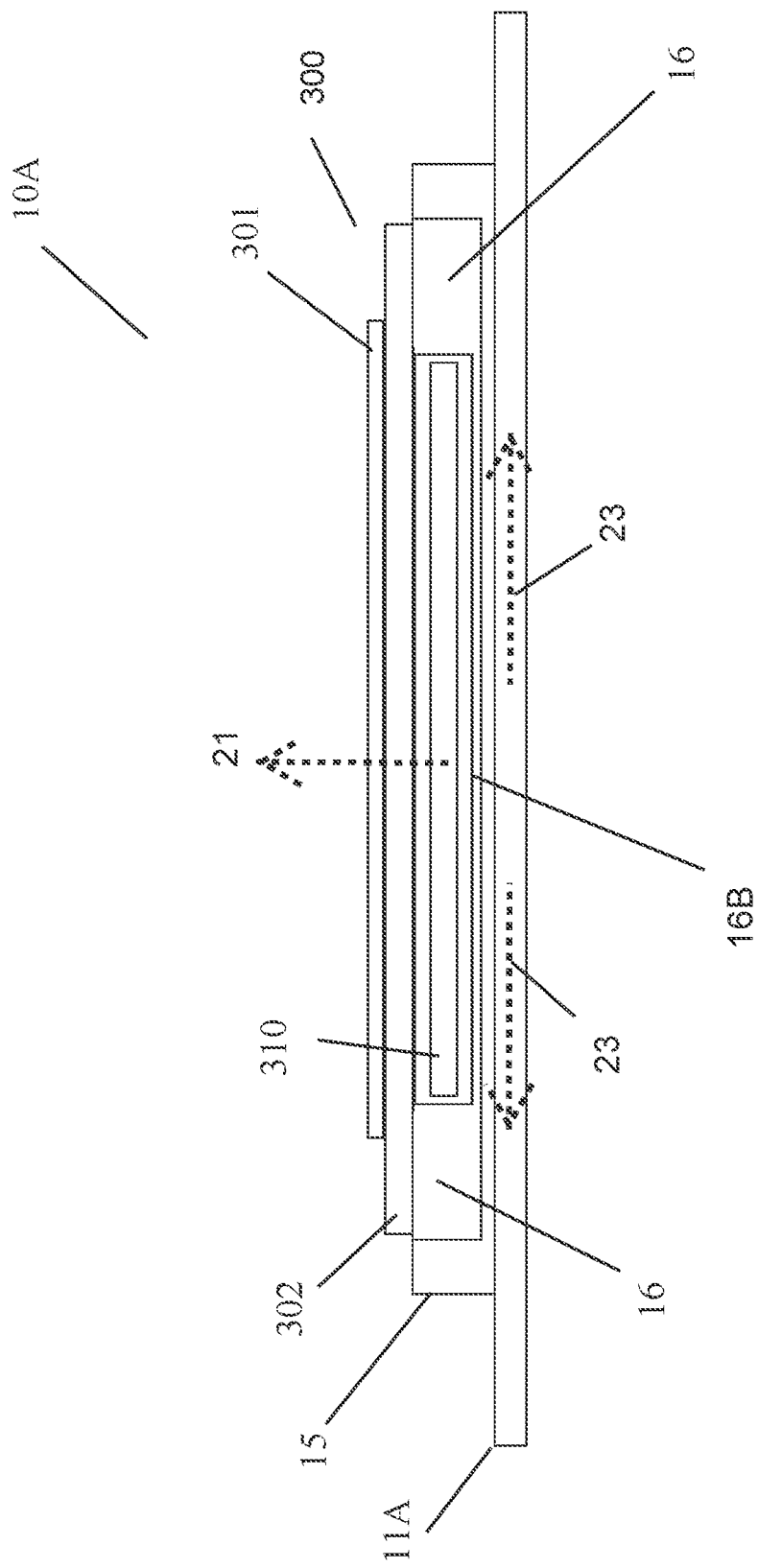
FIG. 20A and FIG. 20B show first and second mounting positions for the second and third semiconductor packages.

Referring to the side view of FIG. 20A, the package 300 may be assembled onto a surface of system board 11A using a socket 15 which may include contacts 16 for establishing electrical connections to the bottom surface 302B of the substrate. Heat may be conducted from the POL module 310 up through the substrate 302, e.g. through conductive features, 305, 307 and the connections there between, up through, and out the top of, the die 301, into a heat sink or lid (not shown) as represented by arrow 21 in FIG. 20A. Optionally, heat may be conducted away from the POL module through the system board 11A as represented by arrows 23 in FIG. 20A.

Figure 20B:
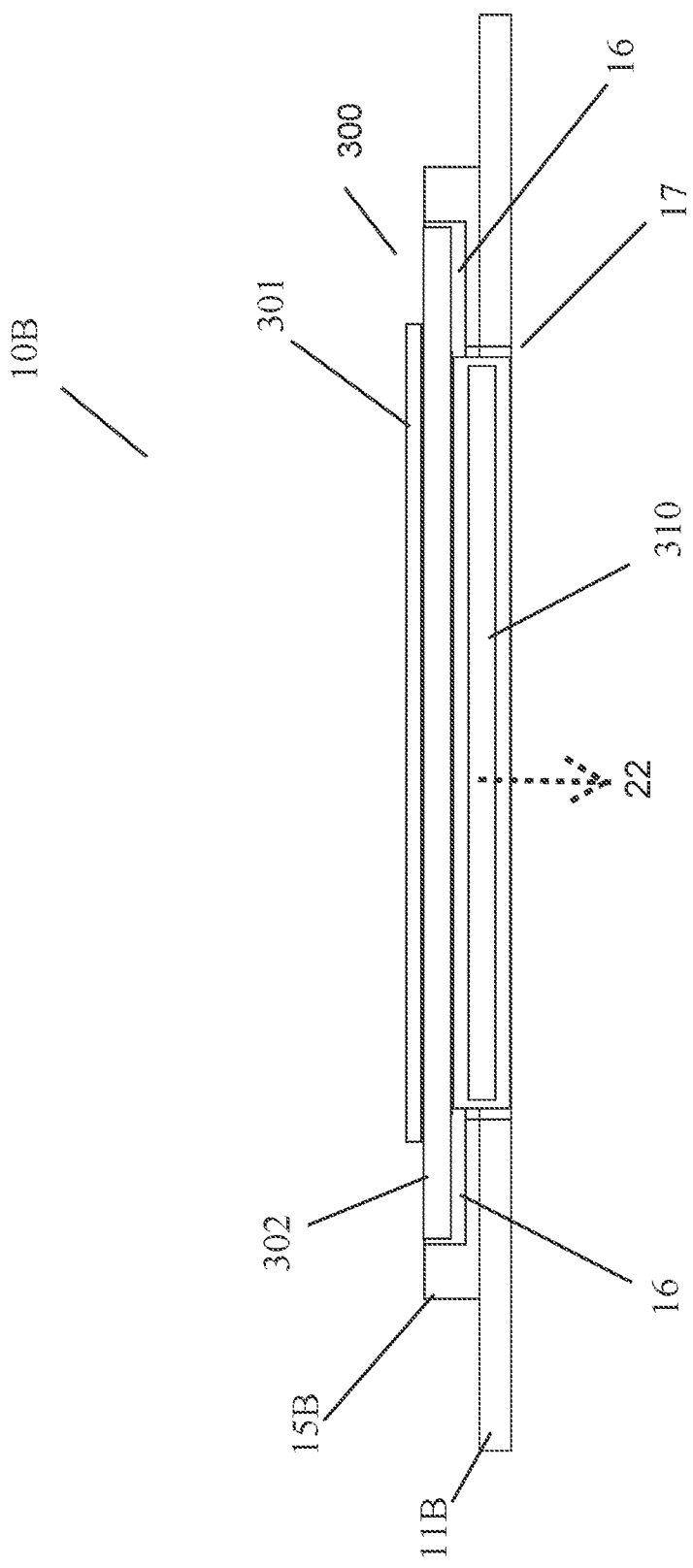

Referring to the side view of FIG. 20B, the package 300 may be assembled onto a surface of system board 11B using a low profile socket 15B having an aperture sized to accommodate the POL module 310 and contacts 16 for establishing electrical connections to the bottom surface 302B of the substrate. However, the system board 11B may include an aperture 17 sized to accommodate the POL module 310, providing a lower profile mounting alternative. In the embodiment of FIG. 20B, heat may be removed from the POL module 310 through the aperture 17 as represented by arrow 22, e.g. using forced air convection, a heat sink, or a cold plate (not shown).

A number of embodiments of the invention have been described. Nevertheless, it will be understood that various modifications may be made without departing from the spirit and scope of the invention. For example, a single resonant capacitor may be used instead of the two resonant capacitors shown in the symmetrical balanced circuit of FIG. 5 and FIG. 6. A center-tapped secondary circuit may be used in place of the full-bridge circuit shown. Although full-bridge driver circuits are shown in FIGS. 5, 6, and 9, a half-bridge primary circuit may be used to drive the power transformer. Although converter topologies having one, and two POL circuits have been shown, it will be appreciated that a larger number of POL circuits may be used. The POL outputs may be connected in parallel as shown to supply higher current loads, or independently for multiple loads. The POL circuits may be deployed within the semiconductor package or at locations near, or adjacent to the semiconductor package or other loads. The magnetically permeable fluid injected into the apertures 155 of the PCB 151 can include a powder with or without a curable medium. There can be two or more semiconductor chips mounted on the substrate 102, in which the semiconductor chips are all powered by the POL modules 110. The magnetically permeable fluid can be a liquid material.

Accordingly, other embodiments are within the scope of the following claims.

What is claimed is:

1. A method of supplying power received from an input source at a source voltage to circuitry on a semiconductor chip mounted in a semiconductor package at a DC load voltage, comprising:
    performing a first power conversion outside of the semiconductor package, the first conversion including receiving power from the source at the source voltage, making a voltage adjustment, and delivering power from a first output to the semiconductor package at a package voltage;
    conducting power from the first output through a portion of the semiconductor package to a point of load (POL) circuit located within the semiconductor package;
    performing a second power conversion in the POL circuit, the second power conversion including receiving the conducted power, making a second voltage adjustment, and delivering power to the semiconductor chip at a chip voltage; and
    performing a third power conversion in circuitry located on the semiconductor chip, the third conversion including receiving power from the POL circuit, making a third voltage adjustment, and delivering power at the load voltage to circuitry on the semiconductor chip;
    wherein the package voltage is at least, 5, times greater than the load voltage.

2. The method of claim 1 wherein the third power conversion comprises voltage regulation.

3. The method of claim 2 wherein the third power conversion comprises linear voltage regulation.

4. The method of claim 2 wherein the third power conversion comprises switching voltage regulation.

5. The method of claim 2 wherein the second power conversion comprises voltage regulation.

6. The method of claim 5 wherein the POL circuit comprises a multi-phase switching regulator.

7. The method of claim 5 wherein the first power conversion comprises an essentially fixed ratio voltage conversion, K=Vo/Vin, at a load current, in which Vin is the source voltage and Vo is the package voltage.

8. The method of claim 5 wherein the package voltage is greater than 20 VDC and the chip voltage is less than 3 VDC.

9. The method of claim 5 wherein the package voltage is greater than 5 VDC and the chip voltage is less than 2 VDC.

10. The method of claim 1 wherein the second power conversion comprises voltage regulation.

11. The method of claim 10 wherein the POL circuit comprises a multi-phase switching regulator.

12. The method of claim 1 wherein the second power conversion comprises an essentially fixed ratio voltage conversion, K=Vo/Vin, at a load current, in which Vin is the package voltage and Vo is the chip voltage.

13. A method of supplying power received from an input source at a source voltage to circuitry on a semiconductor chip mounted in a semiconductor package at a DC load voltage, comprising:
   performing a first power conversion outside of the semiconductor package, the first conversion including receiving power from the source at the source voltage, making a voltage adjustment, and delivering power from a first output to the semiconductor package at a package voltage;
   conducting power from the first output through a portion of the semiconductor package to a point-of-load (POL) circuit located within the semiconductor package and outside of the semiconductor chip;
   performing a second power conversion in the POL circuit, the second power conversion including receiving the conducted power, making a second voltage adjustment, and delivering power to the semiconductor chip at a chip voltage; and
   performing a third power conversion in circuitry located on the semiconductor chip, the third conversion including receiving power from the POL circuit, making a third voltage adjustment, and delivering power at the load voltage to circuitry on the semiconductor chip;
   wherein the package voltage is at least, 5, times greater than the load voltage.

14. The method of claim 13 wherein the third power conversion comprises voltage regulation.

15. The method of claim 14 wherein the third power conversion comprises linear voltage regulation.

16. The method of claim 14 wherein the third power conversion comprises switching voltage regulation.

17. The method of claim 14 wherein the second power conversion comprises voltage regulation.

18. The method of claim 17 wherein the POL circuit comprises a multi-phase switching regulator.

19. The method of claim 17 wherein the first power conversion comprises an essentially fixed ratio voltage conversion, K=Vo/Vin, at a load current, in which Vin is the source voltage and Vo is the package voltage.

20. The method of claim 17 wherein the package voltage is greater than 20 VDC and the chip voltage is less than 3 VDC.

21. The method of claim 17 wherein the package voltage is greater than 5 VDC and the chip voltage is less than 2 VDC.

22. The method of claim 13 wherein the second power conversion comprises voltage regulation.

23. The method of claim 22 wherein the second stage comprises a multi-phase switching regulator.

24. The method of claim 13 wherein the second power conversion comprises an essentially fixed ratio voltage conversion, K=Vo/Vin, at a load current, in which Vin is the package voltage and Vo is the chip voltage.

25. The method of claim 24 wherein the source voltage is greater than 40 VDC.

26. The method of claim 25 wherein the package voltage is greater than 20 VDC and the chip voltage is less than 3 VDC.

27. The method of claim 24 wherein the package voltage is greater than 5 VDC and the chip voltage is less than 2 VDC.

28. The method of claim 13 wherein:
   the semiconductor package comprises a substrate and the semiconductor chip is mounted to the substrate; and
   the POL circuit further comprises one or more semiconductor switches and at least one inductive component, the POL circuit being substantially contained within an electronic package mounted to the substrate.

29. An apparatus comprising:
   a semiconductor package comprising one or more semiconductor chips, each semiconductor chip comprising one or more circuit loads;
   a first power conversion stage disposed outside of the semiconductor package and configured to perform a first power conversion, in which the first power conversion stage is configured to receive power from an input source at a source voltage, make a voltage adjustment, and deliver power from a first output to the semiconductor package at a package voltage;
   a power bus configured to conduct power from the first output through a portion of the semiconductor package to a point-of-load (POL) circuit located within the semiconductor package;
   the POL circuit configured to perform a second power conversion, in which the POL circuit is configured to receive the conducted power, make a second voltage adjustment, and deliver power to at least one of the semiconductor chips mounted in the semiconductor package at a chip voltage; and
   a third power conversion stage located on the semiconductor chip and configured to perform a third power conversion, in which the third power conversion stage is configured to receive power from the POL circuit, make a third voltage adjustment, and deliver power at a load voltage to at least one circuit load on the semiconductor chip, and the package voltage is at least 5 times greater than the load voltage.

30. The apparatus of claim 29 wherein the third power conversion stage comprises a voltage regulator, and performing the third power conversion comprises using the voltage regulator to perform voltage regulation.

31. The apparatus of claim 30 wherein the voltage regulator comprises a linear voltage regulator, and performing the voltage regulation comprises performing linear voltage regulation.

32. The apparatus of claim 30 wherein the third power conversion stage comprises a switching voltage regulator, and performing the third power conversion comprises using the switching voltage regulator to perform switching voltage regulation.

33. The apparatus of claim 30 wherein the POL circuit comprises a voltage regulator, and performing the second power conversion comprises voltage regulation.

34. The apparatus of claim 33 wherein the POL circuit comprises a multi- phase switching regulator.

35. The apparatus of claim 33 wherein the first power conversion comprises an essentially fixed ratio voltage conversion, K=Vo/Vin, at a load current, in which Vin is the source voltage and Vo is the package voltage.

36. The apparatus of claim 33 wherein the package voltage is greater than 20 VDC and the chip voltage is less than 3 VDC.

37. The apparatus of claim 33 wherein the package voltage is greater than 5 VDC and the chip voltage is less than 2 VDC.

38. The apparatus of claim 29 wherein the POL circuit comprises a voltage regulator.

39. The apparatus of claim 38 wherein the POL circuit comprises a multi- phase switching regulator.

40. The apparatus of claim 29 wherein the second power conversion comprises an essentially fixed ratio voltage conversion, K=Vo/Vin, at a load current, in which Vin is the package voltage and Vo is the chip voltage.

41. The apparatus of claim 40 wherein the source voltage is greater than 40 VDC.

42. The apparatus of claim 41 wherein the package voltage is greater than 20 VDC and the chip voltage is less than 3 VDC.

43. The apparatus of claim 40 wherein the package voltage is greater than 5 VDC and the chip voltage is less than 2 VDC.

44. The apparatus of claim 29 wherein:
the semiconductor package comprises a substrate and the one or more semiconductor chips are mounted to the substrate; and
the POL circuit further comprises one or more semiconductor switches and at least one inductive component, the POL circuit being substantially contained within an electronic package mounted to the substrate.

* * * * *

UNITED STATES PATENT AND TRADEMARK OFFICE
CERTIFICATE OF CORRECTION

PATENT NO. : 10,784,765 B1
APPLICATION NO. : 16/299243
DATED : September 22, 2020
INVENTOR(S) : Patrizio Vinciarelli and Andrew T. D'Amico It is certified that error appears in the above-identified patent and that said Letters Patent is hereby corrected as shown below:

On the Title Page

Page 2, Column 2 item (56) (Other Publications); Line 26, delete "1ntersil" and insert -- Intersil --.

In the Specification

Column 23, Line 10, delete "(0" and insert -- ($\mu$) --.

Column 26, Line 17, delete "and or" and insert -- and/or --.

In the Claims

Column 31, Line 10, Claim 34, delete "multi- phase" and insert -- multi-phase --.

Column 32, Line 2, Claim 39, delete "multi- phase" and insert -- multi-phase --.

Signed and Sealed this
Fifth Day of January, 2021

Andrei Iancu
*Director of the United States Patent and Trademark Office*